(12) United States Patent
Kaushal et al.

(10) Patent No.: US 7,101,816 B2
(45) Date of Patent: Sep. 5, 2006

(54) METHODS FOR ADAPTIVE REAL TIME CONTROL OF A THERMAL PROCESSING SYSTEM

(75) Inventors: Sanjeev Kaushal, Austin, TX (US); Kenji Sugishima, Tokyo (JP); Pradeep Pandey, San Jose, CA (US)

(73) Assignee: Tokyo Electron Limited, Tokyo (JP)

( * ) Notice: Subject to any disclaimer, the term of this patent is extended or adjusted under 35 U.S.C. 154(b) by 331 days.

(21) Appl. No.: 10/747,842

(22) Filed: Dec. 29, 2003

(65) Prior Publication Data
US 2005/0149886 A1 Jul. 7, 2005

(51) Int. Cl.
*G06F 19/00* (2006.01)

(52) U.S. Cl. ............ 438/795; 700/109; 700/110; 700/121; 73/760

(58) Field of Classification Search ........ 700/121, 700/109, 110; 73/760; 438/795
See application file for complete search history.

(56) References Cited

U.S. PATENT DOCUMENTS

| | | | |
|---|---|---|---|
| 5,305,417 A | 4/1994 | Najm et al. ............ 392/418 |
| 5,871,805 A | 2/1999 | Lemelson ............ 427/8 |
| 6,100,506 A * | 8/2000 | Colelli et al. ............ 219/446.1 |
| 6,127,288 A * | 10/2000 | Kiyama ............ 438/795 |
| 6,169,271 B1 | 1/2001 | Savas et al. ............ 219/390 |
| 6,344,232 B1 | 2/2002 | Jones et al. ............ 427/8 |
| 6,373,033 B1 | 4/2002 | de Waard et al. ............ 219/497 |
| 6,801,295 B1 * | 10/2004 | Inomata et al. ............ 355/18 |
| 2003/0173346 A1 * | 9/2003 | Renken ............ 219/390 |
| 2003/0199108 A1 | 10/2003 | Tanaka et al. |
| 2004/0056017 A1 * | 3/2004 | Renken ............ 219/444.1 |
| 2005/0053850 A1 * | 3/2005 | Askebjer et al. ............ 430/5 |

OTHER PUBLICATIONS

European Patent Office, *PCT International Search Report*, Mailing Date: May 11, 2005 (4 pages).

* cited by examiner

*Primary Examiner*—Leo Picard
*Assistant Examiner*—Michael D. Masinick
(74) *Attorney, Agent, or Firm*—Wood, Herron & Evans, L.L.P.

(57) ABSTRACT

Methods for adaptive real time control of a system for thermal processing substrates, such as semiconductor wafers and display panels. Generally, the method includes creating a dynamic model of the thermal processing system, incorporating wafer bow in the dynamic model, coupling a diffusion-amplification model into the dynamic thermal model, creating a multivariable controller, parameterizing the nominal setpoints, creating a process sensitivity matrix, creating intelligent setpoints using an efficient optimization method and process data, and establishing recipes that select appropriate models and setpoints during run-time.

26 Claims, 15 Drawing Sheets

METHODS FOR ADAPTIVE REAL TIME CONTROL OF A THERMAL PROCESSING SYSTEM

FIELD OF THE INVENTION

The invention is related to semiconductor processing systems and, in particular, to a system for thermally processing substrates.

BACKGROUND OF THE INVENTION

In a photolithography process for manufacturing semiconductor devices and liquid crystal displays (LCD's), resist is coated on a substrate, and the resultant resist coating film is exposed to light and developed. Such a series of processing stages is carried out in a coating/developing system having discrete heating sections, such as a prebaking unit and a postbaking unit. Each heating section incorporates a hotplate with a built-in heater of a resistance heating type.

Feature sizes of semiconductor device circuits have been reduced to less than 0.1 microns. Typically, the pattern wiring that interconnects individual device circuits is formed with sub-micron line widths. To provide reproducible and accurate feature sizes and line widths, it has been strongly desired to control the heat treatment temperature of the photoresist film more accurately. The substrates or wafers (i.e., objects to be treated) are usually treated or processed under the same recipe (i.e., individual treatment program) in units (i.e., lots) each consisting of, for example, twenty-five wafers. Individual recipes define heat treatment conditions under which prebaking and postbaking are performed. Wafers belonging to the same lot are heated under the same conditions.

According to each of the recipes, the heat treatment temperature may be varied within such an acceptable range that the temperature will not have an effect on the final semiconductor device. In other words, a desired temperature may differ from a heat treatment temperature in practice. When the wafer is treated with heat beyond the acceptable temperature range, a desired photoresist film cannot be obtained. Therefore, to obtain the desired photoresist film, a temperature sensor is used for detecting the temperature of the hotplate. On the basis of the detected temperature, the power supply to the heater may be controlled in a feedback manner. Because the temperature of the entire hotplate is not uniform and varies with the lapse of time, however, it is difficult to determine the temperature of the hotplate by a single temperature sensor at any instant in time.

Post exposure bake (PEB) plays an important role in the photoresist process. Heat-treating a resist may have many purposes from removing the solvent to catalyzing the chemical amplification. In addition to the intended results, heat-treating may cause numerous problems. For example, the light sensitive component of the resist may decompose at temperatures typically used to remove the solvent, which is an extremely serious concern for a chemically amplified resist since the remaining solvent content has a strong impact on the diffusion and amplification rates. Also, heat-treating can affect the dissolution properties of the resist and thus have direct influence on the developed resist profile.

Chemically amplified resists (CAR's) were developed because of the low spectral energy of DUV radiation. CAR's operate for enhancing the exposure process. A CAR comprises one or more components, such as chemical protectors, that are insoluble in the developer and other components, such as photoacid generator (PAG's). During an exposure step, the PAG's produce acid molecules that include the image information. Desirably, the acid molecules remain inactive until a PEB is performed. The PEB drives a deprotection reaction forward in which the thermal energy causes the acid to react with the chemical protectors. CAR's are particularly sensitive to temperature during heat treatment.

What is needed, therefore, is a method for more accurately controlling the temperature in a thermal processing system.

SUMMARY

The invention provides methods for more accurately controlling the temperature of a wafer in a thermal processing system by way of adaptive real time control. In certain embodiments, the method of operating the thermal processing system comprises positioning a wafer being processed by the system on a hotplate comprising a plurality of zones, creating a dynamic thermal model of the system, and establishing a plurality of intelligent setpoints using the thermal model of the system where at least one intelligent setpoint is created for each zone of the hotplate. The method further comprises controlling an actual temperature of each zone using the at least one intelligent setpoint and thereby establish a substantially uniform temperature profile across the wafer.

BRIEF DESCRIPTION OF THE FIGURES

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Figure 1:
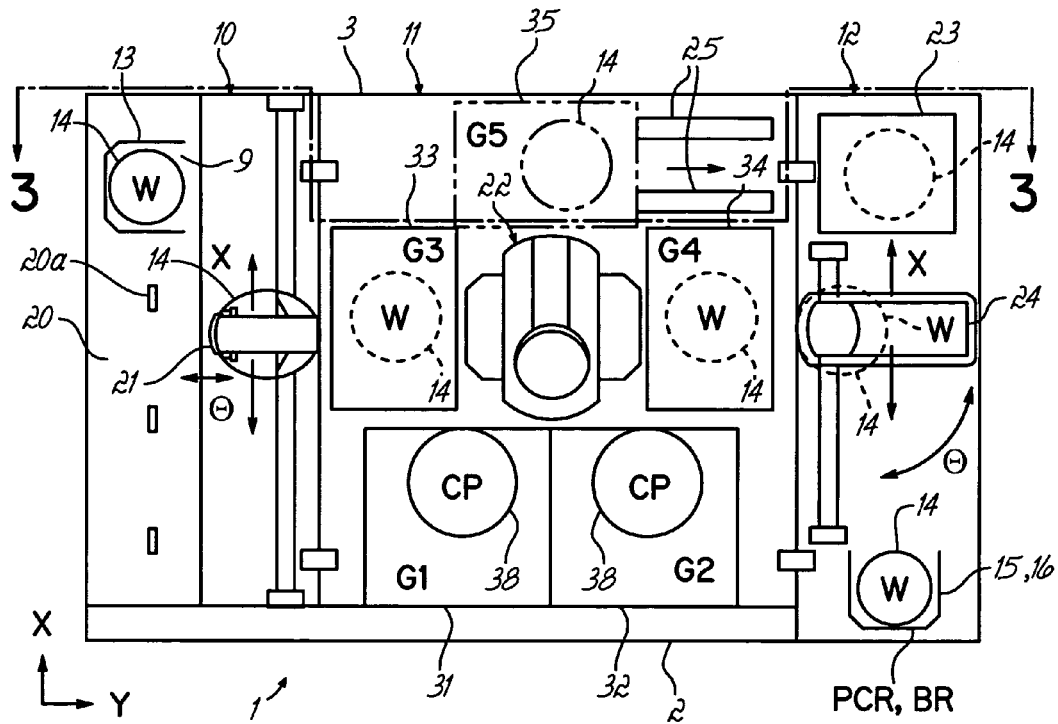
FIG. 1 is a top view of a schematic diagram of a coating/developing system for use in association with the invention.
Figure 2:
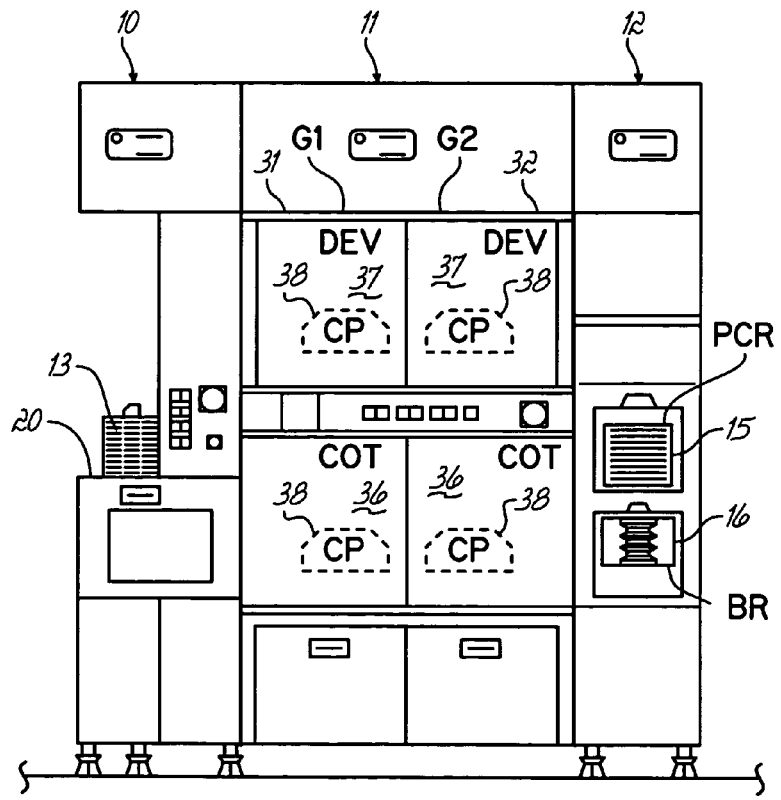
FIG. 2 is a front view of the coating/developing system of FIG. 1.
Figure 3:
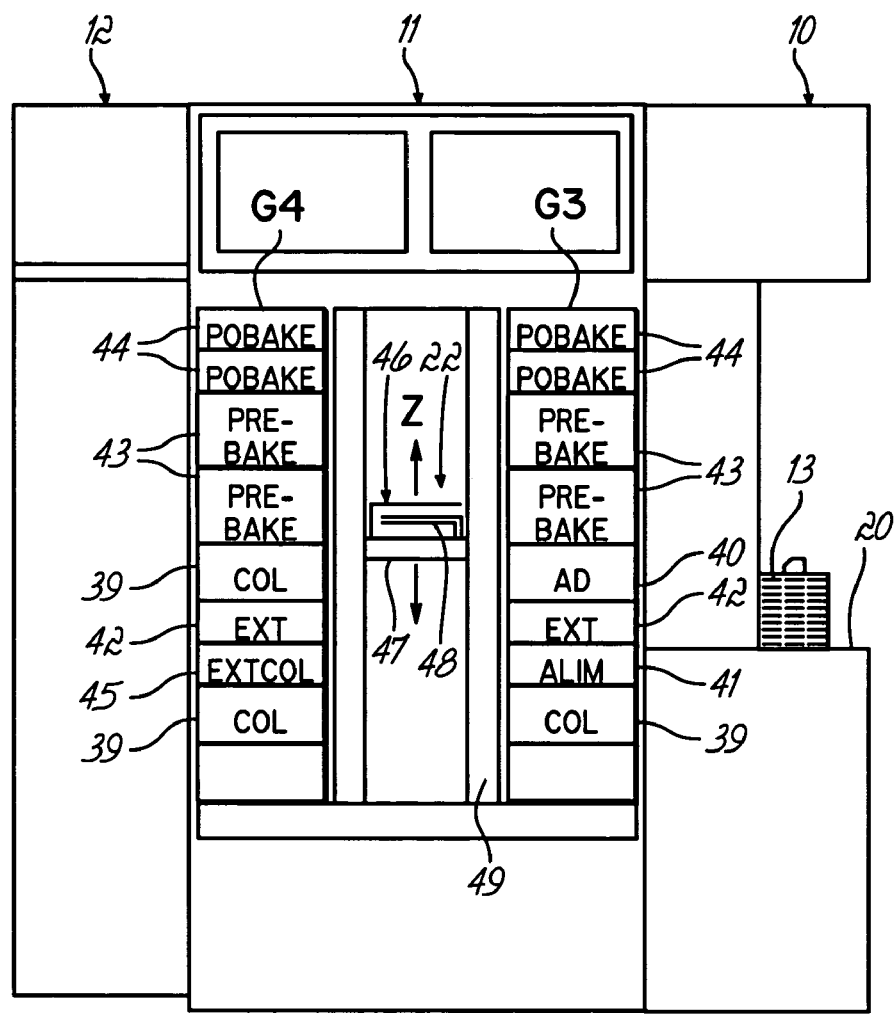
FIG. 3 is a partially cut-away back view of the coating/developing system of FIG. 1.

With reference to FIGS. 1–3, a thermal or coating/developing system 1 has a load/unload section 10, a process section 11, and an interface section 12. The load/unload section 10 has a cassette table 20 on which cassettes (CR) 13 each storing a plurality of semiconductor wafers (W) 14 (e.g., 25) for each, are loaded and unloaded from system 1. The process section 11 has various single wafer processing units for processing wafers 14 sequentially one by one. These processing units are arranged in predetermined positions of multiple stages, for example, within first (G1), second (G2), third (G3), fourth (G4) and fifth (G5) multiple-stage process unit groups 31, 32, 33, 34, 35. The interface section 12 is interposed between the process section 11 and a light-exposure apparatus (not shown).

A plurality of projections 20a are formed on the cassette table 20. A plurality of cassettes 13 are each oriented relative to the process section 11 by these projections 20a. Each of the cassettes 13 mounted on the table 20 has a load/unload opening 9 facing the process section 11.

The load/unload section 10 includes a first sub-arm mechanism 21 that is responsible for loading/unloading the wafer W into/from each cassette 13. The first sub arm mechanism 21 has a holder portion for holding the wafer 14, a back and forth moving mechanism (not shown) for moving the holder portion back and forth, an X-axis moving mechanism (not shown) for moving the holder portion in an X-axis direction, a Z-axis moving mechanism (not shown) for moving the holder portion in a Z-axis direction, and a θ (theta) rotation mechanism (not shown) for swinging the holder portion around the Z-axis. The first sub-arm mechanism 21 can gain access to an alignment unit (ALIM) 41 and an extension unit (EXT) 42 belonging to a third process unit group G3.

With specific reference to FIG. 3, a main arm mechanism 22 is liftably arranged at the center of the process section 11. The process units G1–G5 are arranged around the main arm mechanism 22. The main arm mechanism 22 is arranged within a cylindrical supporting body 49 and has a liftable wafer transporting apparatus 46. The cylindrical supporting body 49 is connected to a driving shaft of a motor (not shown). The driving shaft may be rotated about the Z-axis in synchronism with the wafer transporting apparatus 46 by an angle of θ. The wafer transporting apparatus 46 has a plurality of holder portions 48 movable in a front and rear direction of a transfer base table 47.

Units belonging to first (G1) and second (G2) process unit groups 31, 32, are arranged at the front portion 2 of the system 1. Units belonging to the third (G3) process unit group 33 are arranged next to the load/unload section 10. Units belonging to a fourth (G4) process unit group 34 are arranged next to the interface section 12. Units belonging to a fifth (G5) process unit group 35 are arranged in a back portion 3 of the system 1.

With reference to FIG. 2, the first (G1) process unit group 31 has two spinner-type process units for applying a predetermined treatment to the wafer 14 mounted on a spin chuck within the cup CP. In the first (G1) process unit 31, for example, a resist coating unit (COT) 36 and a developing unit (DEV) 37 are stacked in two stages sequentially from the bottom. In the second (G2) process unit group 32, two spinner type process units such as a resist coating unit (COT) 36 and a developing unit (DEV) 37, are stacked in two stages sequentially from the bottom. The resist coating unit (COT) 36 is preferably set at a lower stage than the developing unit (DEV) 37. This is because a discharge line (not shown) for the resist waste solution is desired to be shorter than a developing waste solution since the resist waste solution is more difficult to discharge than the developing waste solution. However, if necessary, the resist coating unit (COT) 36 may be arranged at an upper stage than the developing unit (DEV) 37.

With reference to FIG. 3, the third (G3) process unit group 33 has a cooling unit (COL) 39, an alignment unit (ALIM) 41, an adhesion unit (AD) 40, an extension unit (EXT) 42, two prebaking units (PREBAKE) 43, and two postbaking units (POBAKE) 44, which are stacked sequentially from the bottom.

Similarly, the fourth (G4) process unit group 34 has a cooling unit (COL) 39, an extension-cooling unit (EXT-COL) 45, an extension unit (EXT) 42, another cooling unit (COL) 39, two prebaking units (PREBAKE) 43 and two postbaking units (POBAKE) 44.

As mentioned above, it is preferable that the cooling unit (COL) 39 and the extension cooling unit (EXTCOL) 45 to be operated at low processing temperatures, be arranged at lower stages and the prebaking unit (PREBAKE) 43, the postbaking unit (POBAKE) 44 and the adhesion unit (AD) 40, to be operated at high temperatures, be arranged at the upper stages. With this arrangement, thermal interference between units may be reduced.

At the front side of the interface section 12, a movable pick-up cassette (PCR) 15 and a non-movable buffer cassette (BR) 16 are arranged in two stages. At the backside of the interface section 12, a peripheral light exposure apparatus 23 is arranged. At the center portion of the interface section 12, a second sub-arm mechanism 24 is provided, which is movable independently in the X and Z directions, and which is capable of gaining access to both cassettes (PCR) 15 and (BR) 16 and the peripheral light exposure apparatus 23. In addition, a second sub-arm mechanism 24 is rotatable around the Z-axis by an angle of θ and is designed to be able to gain access not only to the extension unit (EXT) 42 located in the fourth (G4) processing unit 34 and but also to a wafer transfer table (not shown) near the light exposure apparatus (not shown).

In the system 1, the fifth (G5) processing unit group 35 may be arranged at the back portion 3 of the backside of the main arm mechanism 22. The fifth (G5) processing unit 35 may be slidably shifted in the Y-axis direction along a guide rail 25. Since the fifth (G5) processing unit group 35 may be shifted as mentioned, maintenance operation may be applied to the main arm mechanism 22 easily from the backside.

As described, the cooling unit (COL) 39 and the extension cooling unit (EXTCOL) 45 are operated at low processing temperatures and arranged at lower stages, and the prebaking unit (PREBAKE) 43, the postbaking unit (POBAKE) 44 and the adhesion unit (AD) 40 are operated at high temperatures and arranged at the upper stages. With this arrangement, thermal interference between units may be reduced. Alternatively, these units may have different arrangements.

Figure 4:
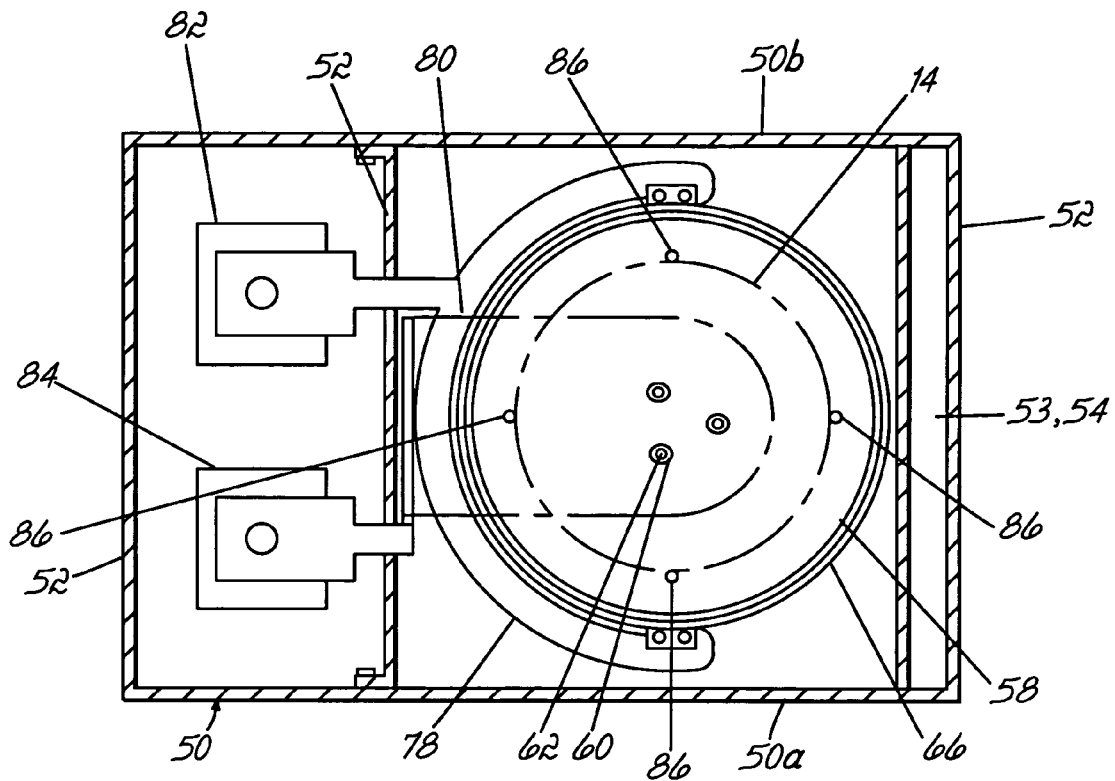
FIG. 4 is a perspective plan view of a single heat treatment apparatus of FIG. 3.
Figure 5:
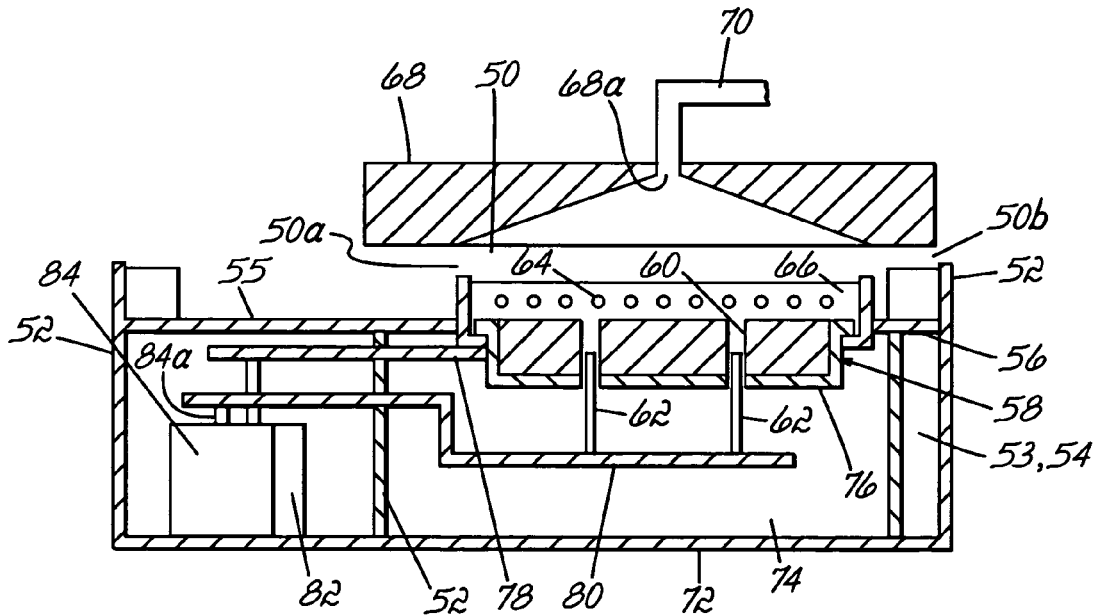
FIG. 5 is a cross-sectional view of the heat treatment apparatus of FIG. 4.

With reference to FIGS. 4 and 5, the prebaking unit (PREBAKE) 43, the postbaking unit (POBAKE) 44, and the adhesion unit (AD) 40 each comprise a heat treatment apparatus in which wafers 14 are heated to temperatures above room temperature. Each heat treatment apparatus includes a processing chamber 50, a hotplate 58, and a resistance heater (not shown) embedded in the hotplate 58.

The hotplate 58 has a plurality of through-holes 60 and a plurality of lift pins 62 inserted into the through-holes 60. The lift pins 62 are connected to and supported by an arm 80, which is further connected to and supported by a rod 84a of a vertical cylinder 84. When the rod 84a is actuated to protrude from the cylinder 84, the lift pins 62 protrude from the hotplate 58, thereby lifting the wafer 14.

With continued reference to FIGS. 4 and 5, the processing chamber 50 is defined by a sidewall 52, a horizontal shielding plate 55, and a cover 68. Openings 50A, 50B are formed at a front surface side (aisle side of the main arm mechanism 22) and a rear surface side of the processing chamber, respectively. The wafer 14 is loaded into and unloaded from the processing chamber 50 through the openings 50A, 50B. A circular opening 56 is formed at the center of the horizontal shielding plate 55. The hotplate 58 is housed in the opening 56. The hotplate 58 is supported by the horizontal shielding plate 55 with the aid of a supporting plate 76.

A ring-form shutter 66 is attached to the outer periphery of the hotplate 58. Air holes 64 are formed along the periphery of the shutter 66 at intervals of central angles of two degrees. The air holes 64 communicate with a cooling gas supply source (not shown).

The shutter 66 is liftably supported by a cylinder 82 via a shutter arm 78. The shutter 66 is positioned at a place lower than the hotplate 58 at non-operation time, whereas, at an operation time, shutter 66 is lifted up to a position higher than the hotplate 58 and between the hotplate 58 and the cover 68. When the shutter 66 is lifted up, a cooling gas, such as nitrogen gas or air, is exhausted from the air holes 64.

With continued reference to FIGS. 4 and 5, an exhaust port 68a at the center of the cover 68 communicates with an exhaust pipe 70. Gas generated from the surface of the wafer 14 at the heat treatment detected temperature time is exhausted through the exhaust port 68a and vented from the processing chamber 50 via exhaust pipe 70 to an evacuation unit (not shown).

A compartment 74 defined by the shielding plate 55, two sidewalls 53, and a bottom plate 72 is formed below the horizontal shielding plate 55. Hotplate supporting plate 76, shutter arm 78, lift pin arm 80, and liftable cylinders 82, 84 are arranged in the compartment 74.

With reference to FIG. 4, a plurality of projections 86 are formed on an upper surface of the hotplate 58 for accurately positioning the wafer 14. In addition, a plurality of smaller projections (not shown) is formed on the upper surface of the hotplate 58. When the wafer 14 is mounted on the hotplate 58, top portions of these smaller projections contacts the wafer 14, which produces a small gap between the wafer 14 and the hotplate 58 that prevents the lower surface of the wafer 14 from being strained and damaged.

Figure 6:
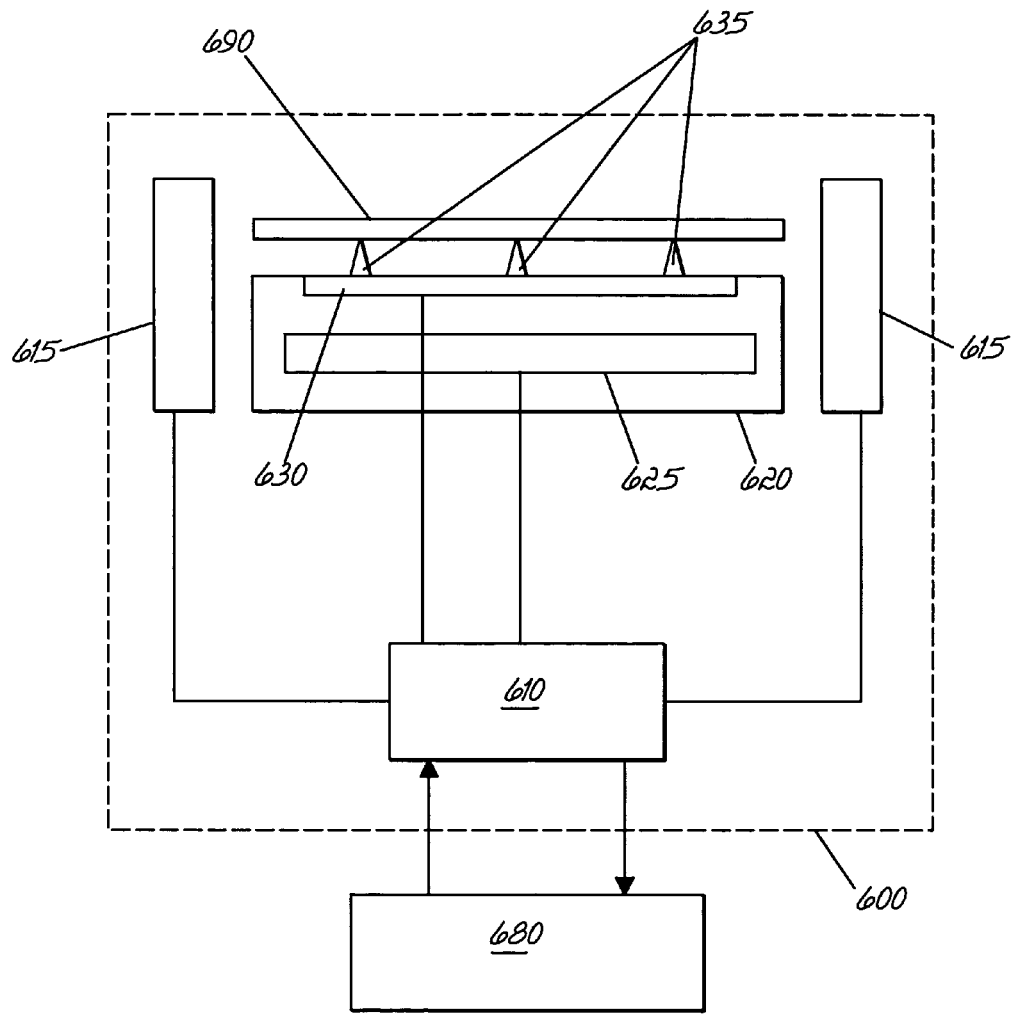
FIG. 6 is a diagrammatic view of a hotplate of the heat treatment apparatus in accordance with an embodiment of the invention.

With reference to FIG. 6, a heat treatment apparatus 600 in accordance with an embodiment of the invention includes a controller 610, a cooling device 615, and a hotplate 620. Hotplate 620 includes a heater 625, a sensor 630, and wafer support pins 635. A wafer 690 may be positioned on hotplate 620 using wafer support pins 635.

Hotplate 620 may have a circular shape and may comprise a number of segments (not shown). In addition, heater 625 may comprise a number of heating elements (not shown). For example, a heating element may be positioned within each segment of the hotplate 620. In an alternate embodiment, hotplate 620 may incorporate a cooling element and/or a combined heating/cooling element rather than a heating element.

Hotplate 620 may include a sensor 630, which may be a physical sensor and/or a virtual sensor. For example, sensor 630 may be a temperature sensor located within each hotplate segment. In addition, sensor 630 may include at least one pressure sensor. Controller 610 may be coupled to heater 625 and sensor 630. Various types of physical temperature sensors 630 may be used. For example, the sensors 630 can include a thermocouple, a temperature-indicating resistor, a radiation type temperature sensor, and the like. Other physical sensors 630 include contact-type sensors and non-contact sensors.

Heat treatment apparatus 600 may be coupled to a processing system controller 680 capable of providing feed-forward data for an incoming wafer to heat treatment apparatus 600. Feed-forward data can include wafer information, layer information, process information, and metrology information. Wafer information can include composition data, size data, thickness data, and temperature data. Layer information can include the number of layers, the composition of the layers, and the thickness of the layers. Process information can include data concerning previous steps and the current step. Metrology information can include optical digital profile (ODP) data, such as critical dimension (CD) data, profile data, and uniformity data, and optical data, such as refractive index (n) data and extinction coefficient (k) data. For example, CD data and profile data can include information for features and open areas in one or more layers, and can also include uniformity data.

Layer information extracted from the feed forward data may be used by the controller 610 to estimate wafer stresses. Controller 610 also includes a device for determining wafer flatness. Controller 610 may predict the thermal response for the incoming wafer based on the layer information, the CD data, the profile data, and the uniformity data that it receives. The controller 610 can then create at least one intelligent setpoint for each of the plurality of hotplate segments, as described herein. The incoming wafer is then heated in a uniform manner because the intelligent setpoints have been computed to compensate for the wafer's profile.

Controller 610 may comprise a microprocessor, a memory (e.g., volatile and/or non-volatile memory), and a digital I/O port. A program stored in the memory may be utilized to control the aforementioned components of a heat treatment apparatus according to a process recipe. Controller 610 may be configured to analyze the process data, to compare the process data with target process data, and to use the comparison to change a process and/or control the processing system components. Alternatively, the controller 610 may be configured to analyze the process data, to compare the process data with historical process data, and to use the comparison to predict and/or establish an endpoint.

A ventilation system 615 is provided around the hotplate 620. Air or nitrogen gas may be provided to one or more surfaces of the hotplate 620 by ventilation system 615. For example, a shutter 66 and ventilation ports 64 (FIG. 5) may be used. The ventilation system 615 can communicate with a gas supply source (not shown) at the upstream. Controller 610 can control the flow rate of gas flowing from the ventilation system. In an alternate embodiment, heat treatment apparatus 600 may include a monitoring device (not shown) that, for example, permits optical monitoring of the wafer.

Figure 7A:
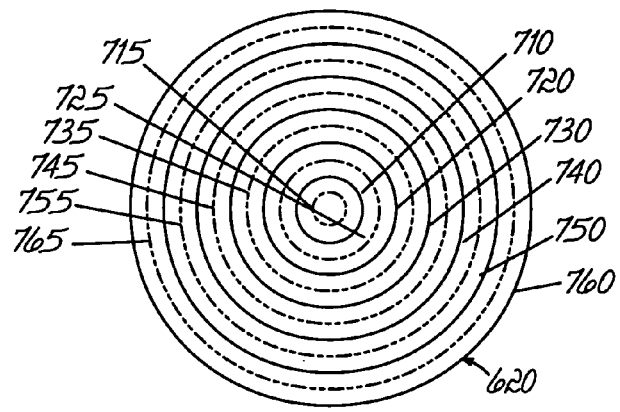
FIGS. 7A and 7B are diagrammatic views of hotplates in accordance with embodiments of the invention.
Figure 7B:
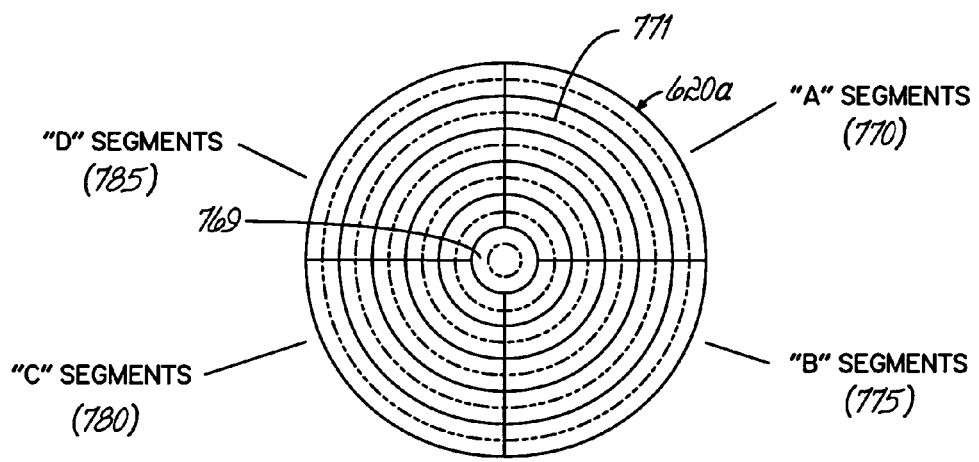

FIGS. 7A and 7B show exemplary schematic views of hotplates in accordance with an embodiment of the invention. In FIG. 7A, a circular hotplate 620 has a circular segment 710 and a plurality of annular ring segments 720, 730, 740, 750, and 760. Hotplate 620 may include any number of segments, which may have any suitable geometrical arrangement and/or dimensions. For example, the annular ring segments may have different radial dimensions relative to the hotplate centerline. In the illustrated embodiment, each segment 720, 730, 740, 750, and 760 includes a corresponding one of a plurality of heating elements 715, 725, 735, 745, 755, and 765 each of which may be independently controlled.

With reference to FIG. 7B, a circular hotplate 620a has a circular central segment 769 and a plurality of sectors 770, 775, 780, 785. Equal radial dimension segments are shown in FIG. 7B, but this is not required for the invention. Hotplate 620a may include any number of sectors, which may have any suitable geometrical arrangement and/or dimensions. In the illustrated embodiment, each individual sector segment 770, 775, 780, 785 includes one of a plurality of heating elements 771 that may each be independently controlled.

Figure 8:
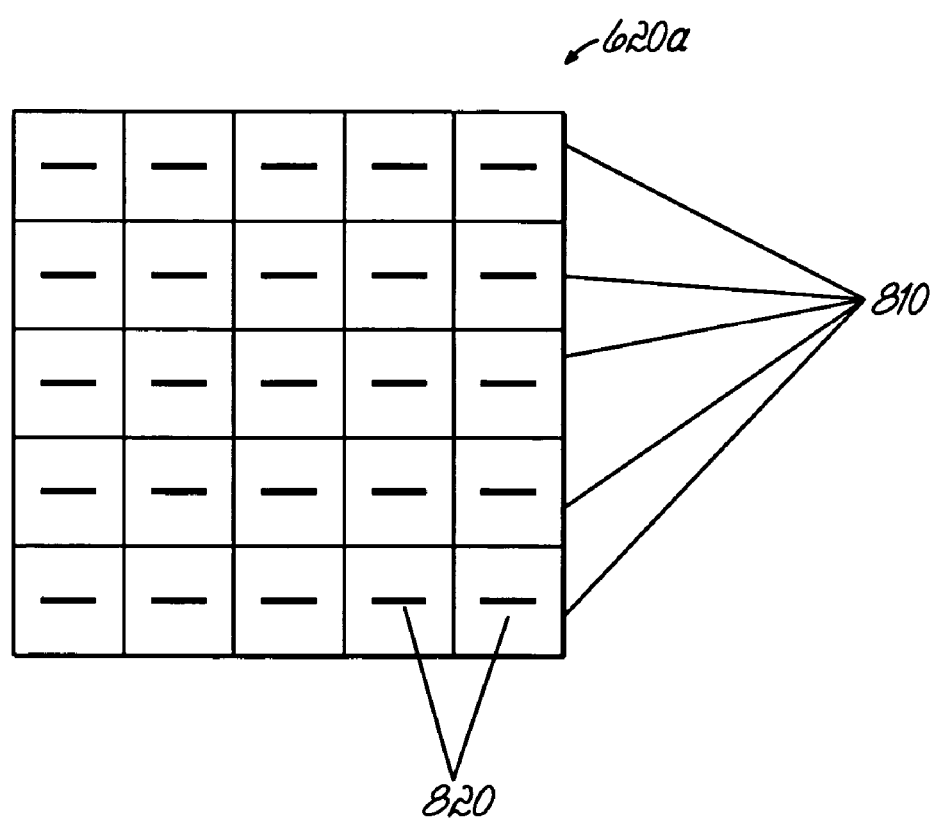
FIG. 8 is a diagrammatic view of a hotplate in accordance with an alternative embodiment of the invention.

FIG. 8 shows a schematic view of another hotplate 620b, in accordance with an embodiment of the invention, having a plurality of, for example, forty-nine square segments 810. Hotplate 620c may comprise a different number of segments 810, and the segments 810 may be shaped differently. For example, rectangular shapes may be used. In the illustrated embodiment, each segment 810 of the hotplate 620b includes a heating element 820, and each heating element 820 may be independently controlled.

Alternately, any of hotplates 620 and 620a–b may be constructed in the jacket form having at least one hollow and at least one recess. The wafer 690 (FIG. 6) may be heated by circulating a heat medium to the recesses, such as by inserting a heater or a heat pipe (not shown) into one or more recesses containing a liquid (heat medium). Alternatively, the hotplate may be heated to a predetermined heat treatment temperature by allowing at least one hollow to be filled with vapor generated from a heat medium by application of heat thereto at one or more of the recesses.

A key requirement for the processing of wafers is tight CD control, tight profile control, and tight uniformity control—both wafer-in-wafer and wafer-to-wafer. For example, variations in CD measurements, profile measurements, and uniformity measurements are caused by variations in thermal profile across wafer zones and variations in thermal response from wafer to wafer. An adaptive real time CD (ARCD) control system may be used to overcome these problems.

Figure 9:
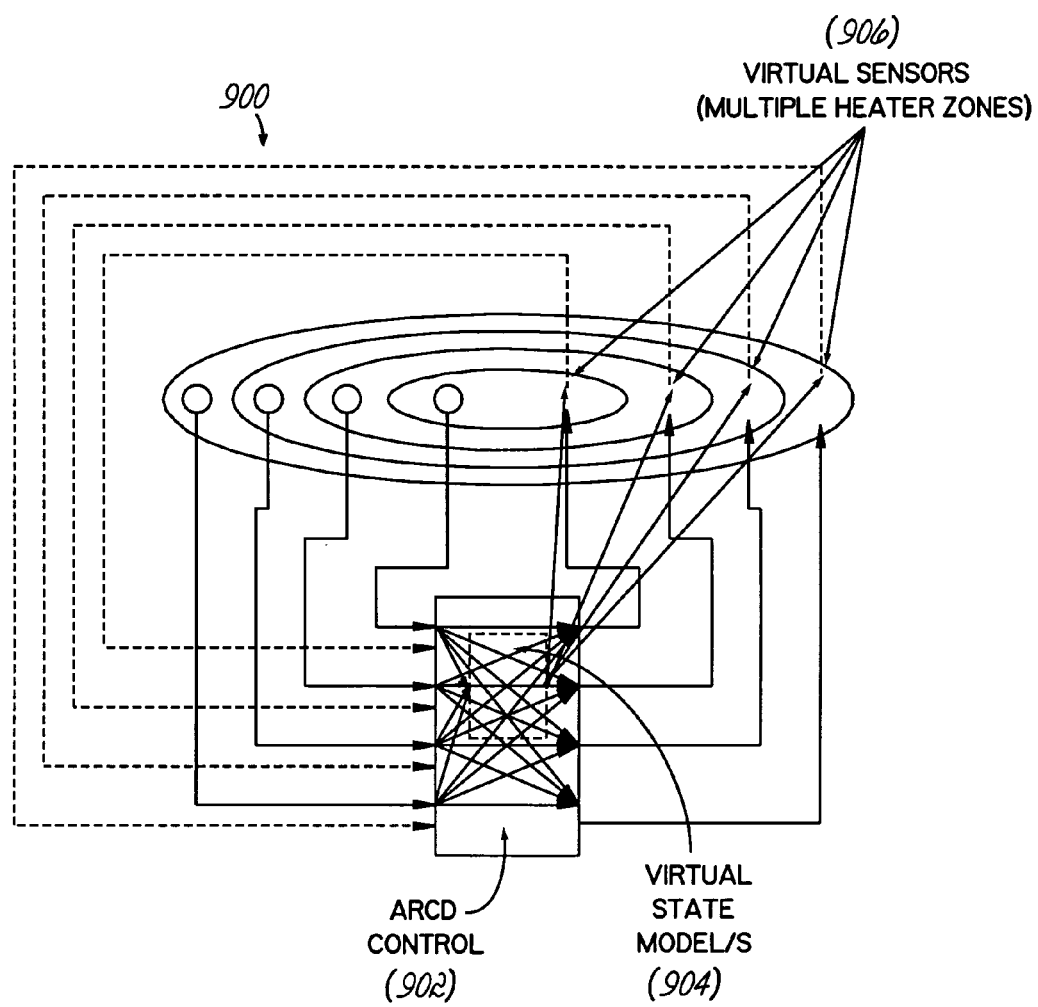
FIG. 9 is a diagrammatic representation of a thermal processing system including multivariable control in accordance with an embodiment of the invention.

FIG. 9 illustrates a simplified block diagram of a thermal processing system 900 including multivariable control in accordance with an embodiment of the invention. An ARCD control system 902 includes virtual sensing with virtual sensors 906 that enables a user to "measure" wafer temperatures in real-time and eliminates the need for instrumented wafers during production, multivariable real-time control that enables control of wafer temperatures and can comprise time-varying setpoints, and intelligent setpoint control that enables uniform CDs and profiles across the wafer and that may use ODP technology to obtain CD, profile, and uniformity measurements. Dynamic (e.g., virtual state) models 904 characterizing the thermal response of the system may be created using instrumented wafers 970 (FIG. 15) and may include the interaction between heater zones of the hotplate and the wafer 690 (FIG. 6). Then, the dynamic model 904 may be used to create a multi-variable controller that controls the estimated wafer temperatures in real-time. For example, a set of dynamic models 904 may be created for the various wafer types to be processed, which can account for wafer bowing and can compensate in real-time for the variation in thermal response. The invention can apply these techniques to reduce wafer-in-wafer variation, reduce wafer-to-wafer variation, minimize the impact of wafer bowing, and improve hotplate matching. For example, an intelligent setpoint control (ISC) methodology may be established for the post-exposure bake (PEB) process.

Figure 10:
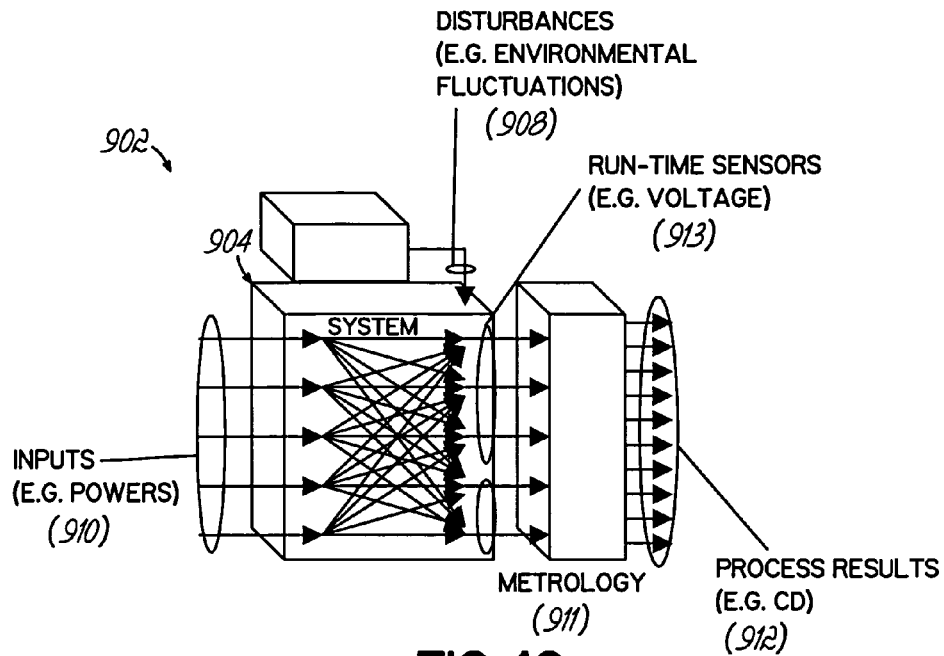
FIG. 10 is a simplified block diagram for a multi-input/multi-output (MIMO) system in accordance with an embodiment of the invention.

With reference to FIG. 10, the ARCD control 902 may be described by a multivariable multi-input/multi-output (MMO) system 907, in accordance with one embodiment of the invention, having several input and output channels. In general, real-life systems, such as the illustrated MIMO system 907, are dynamically complex and non-linear. Their transient responses are important for performance and are often difficult to determine. The outputs of the system or the process results 912 may be affected by unknown disturbances 908, such as environmental fluctuations. In general, for MIMO systems 907, each input (e.g., heater power) 910 can affect multiple outputs (e.g., gas flow, film thickness) 912. The metrology 911, constituting the feed-forward data in one embodiment of the invention, is measured by the run-time sensors 913.

Figure 11:
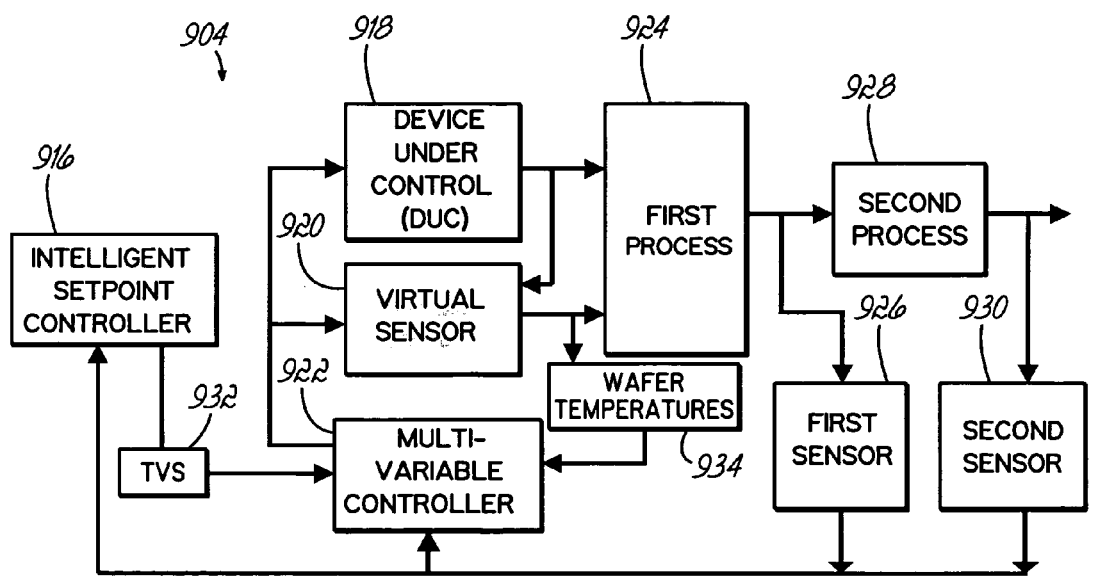
FIG. 11 is a simplified block diagram of a thermal processing system including an intelligent setpoint controller in accordance with an embodiment of the invention.

With reference to FIG. 11, the dynamic model 904 includes an intelligent setpoint controller 916, a device under control (DUC) 918, a virtual sensor 920, and a multivariable controller 922. For example, the device under control (DUC) 918 may be a thermal processing system including a hotplate. The dynamic model 904 performs a first process 924 monitored by a first sensor 926. For example, the first process 924 may be a post-exposure bake process and the first sensor 926 can provide output data and/or error data from the first process 924. The dynamic model 904 may also perform a second process 928 monitored by a second sensor 930. For example, a second process 928 may be a develop process and the second sensor 930 can provide output data and/or error data from the second process 928. In one embodiment, the second sensor 930 may be an ODP sensor and the ODP sensor can provide CD data, profile data, and uniformity data. Alternately, the second sensor 930 may be a Scanning Electron Microscope (SEM).

The intelligent setpoint controller 916 can calculate and provide time varying setpoints (TVS) 932 to the multivariable controller 922. The intelligent setpoint controller 916 and the multivariable controller 922 can comprise hardware and software components. The virtual sensor 920 can provide wafer temperatures and/or hotplate temperatures 934 to the multivariable controller 922.

Figure 12:
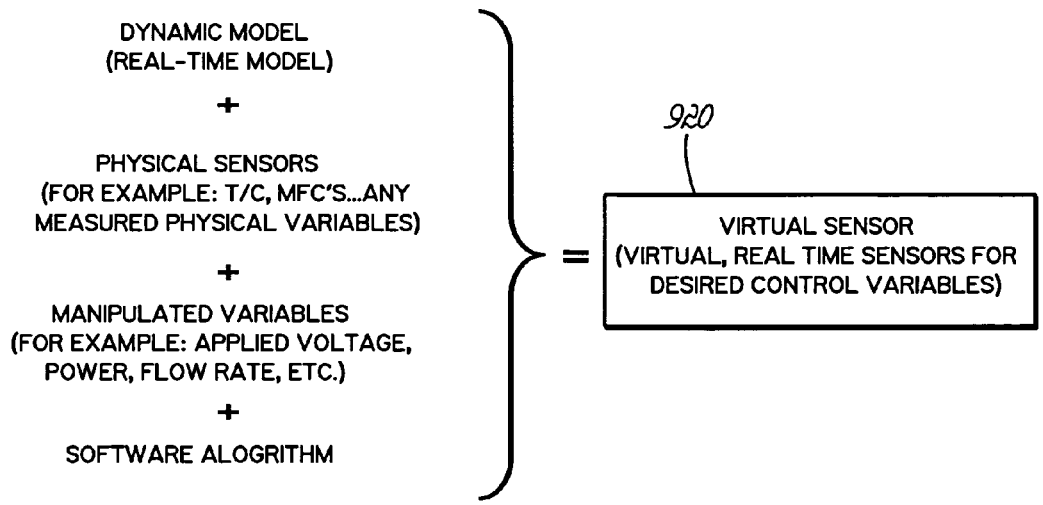
FIG. 12 is a schematic representation of the virtual sensor of FIG. 11.

FIG. 12 illustrates a schematic representation of the virtual sensor 920 in accordance with an embodiment of the invention. In the illustrated embodiment, a virtual sensor 920 is shown that comprises a dynamic model component or a real-time model, a physical sensor component that measures a physical variable such as temperature, a manipulated variables component that regulates a variable such as applied voltage or power to the heater, and a software algorithm component that relates the dynamic model component in conjunction with information from the physical sensors and the manipulated variables. The virtual sensor 920 may be viewed as a compound device comprising an algorithm-based consolidation of information from multiple "physical" sensors. The virtual sensor 920 is an adaptive device that can provide historical data, real-time data, and predictive data.

Figure 13:
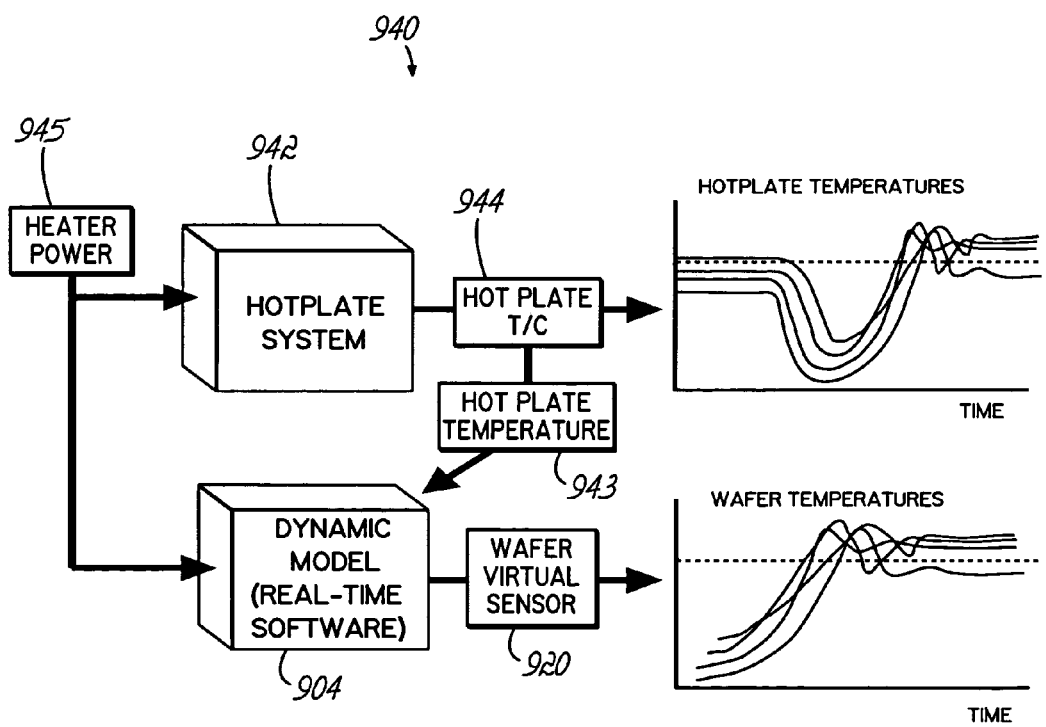
FIG. 13 is a schematic representation of a thermal processing system including a virtual sensor in accordance with an embodiment of the invention.

FIG. 13 illustrates a schematic representation of a thermal processing system 940 including an embodiment of the virtual sensor 920 for measuring the temperature of a wafer heated by a hotplate system 942. The virtual sensor 920 allows the wafer temperatures to be "measured" and controlled using hotplate temperatures 943, which are measured using a hot plate thermocouple 944, by varying the applied power 945 to the heater. The dynamic model 904 is constructed detailing the dynamic interaction between the hotplate system 942 and the wafer 690 (FIG. 6) including variations in the wafer's composition and flatness (i.e., bow). Virtual sensing provides a method for obtaining wafer temperatures in real-time.

Virtual sensors 920 eliminate the need for instrumented wafer(s) during production. For example, the model 904 and virtual sensors 920 may be created once for the hotplate system 942, the model 904 may be tuned with a few wafers during initial qualification of specific equipment, and the system 940 is then ready for production. Server-based software may be used for any re-tuning.

Figure 14:
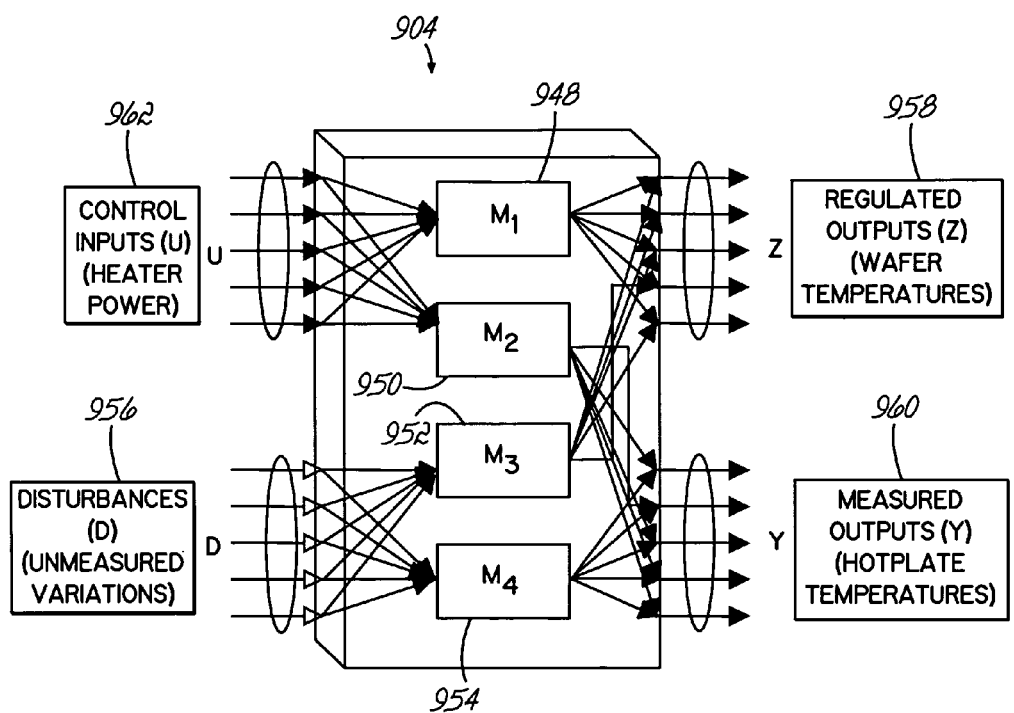
FIG. 14 is a schematic representation of a dynamic model of a thermal processing system in accordance with an embodiment of the invention.

FIG. 14 illustrates a schematic representation of an embodiment of the dynamic model 904 characterizing the thermal response of a thermal processing system in accordance with an embodiment of the invention. In the illustrated embodiment, four nodes or model components ($M_1$, $M_2$, $M_3$, and $M_4$) 948, 950, 952, 954 are shown. However, in alternative embodiments of the invention, a different number of model components may be used, and the model components may be arranged with a different architecture.

In addition, the dynamic model 904 receives control inputs (U), such as heater power, and disturbance inputs (D) 956, such as unmeasured variations, and determines regulated outputs (Z) 958, such as wafer temperatures, and measured outputs (Y) 960, such as hotplate temperatures. The model structure may be expressed as $Z=M_1U+M_3D$ and $Y=M_2U+M_4D$. Alternately, a different expression for the model structure may be used.

The dynamic model 904 tracks the "state" of the system, and relates the inputs 962 to outputs 958, 960 in real-time. For example, U, Y may be measured, and by using the dynamic model 904, D may be estimated using $Y=M_2U+M_4D_{est}$ and Z may be estimated using $Z_{est}=M_1U+M_3D_{est}$.

When creating the dynamic model 904, wafer bow and diffusion-amplification effects may be incorporated into the model. Multivariable controllers (not shown) may be used to calculate the zone-to-zone interaction during the ramp and stabilization modes. An intelligent setpoint controller of model 904 may be used to parameterize the nominal setpoints, create intelligent setpoints using an efficient optimization method and process data, and select appropriate models and setpoints during run-time.

One step in an intelligent setpoint control (ISC) methodology to construct an intelligent setpoint controller 916 (FIG. 11) is to create a dynamic model 904 that describes the dynamic behavior of a processing system, such as a thermal processing system. Such dynamic models 904 may be used to design a multivariable controller and then for creating the sensitivity matrix and the intelligent setpoints.

Several approaches are available for creating dynamic models 904 including, but not limited to, first principles models based on heat transfer, gas flow, and reaction kinetics, and on-line models created with real-time data collected from a processing system, such as a thermal processing system.

In a first principles dynamic model for characterizing the intelligent set point controller 916 (FIG. 11), the wafer and hotplate can comprise several concentric elements, and the heat transfer between the wafer and hotplate as well as to the ambient environment may be modeled for each element. For example, the wafer may be partitioned into n such concentric elements, and the following mathematical relationship shows the thermal response of the $k^{th}$ such element:

$$\rho C_p V_k \frac{dT_k}{dt} = -\frac{k_a A_k}{\delta_k}(T_k - T_p) - hA_k(T_k - T_a) - \frac{k_w C_k}{d_k}(T_k - T_{k-1}) - \frac{k_w C_{k+1}}{d_{k+1}}(T_k - T_{k+1})$$

where the parameters are:
$k_w$ Wafer thermal conductivity
$V_k$ Volume of $k^{th}$ element
$A_k$ Area of $k^{th}$ element
$d_k$ Distance between the $k^{th}$ and the $(k-1)^{th}$ element
$C_k$ Contact area between the $k^{th}$ and the $(k-1)^{th}$ element
$\delta_k$ Air gap distance between the $k^{th}$ and the hotplate
$\rho$ Wafer density
$C_p$ Wafer heat capacity
$T_a$ Ambient temperature
h Heat transfer coefficient to ambient
$k_a$ Air gap thermal conductivity
$T_p$ Hotplate temperature
$T_k$ Wafer temperature The parameter $\delta_k$ depends on the location of the element and may be specified according to the wafer shape. Similarly, the hotplate is also partitioned into concentric elements and described by a similar mathematical relationship.

In one embodiment for modeling the ISC, thermocouples are assumed to be co-located with the heater in the hotplate and any dynamics (e.g., time constants for thermocouple response) associated with the thermocouples are not included in the model. In effect, the model assumes instantaneous temperature measurements. Alternately, thermocouples are not co-located with the heater in the hotplate, and/or any dynamics associated with the thermocouples may be included in the model. The heat transfer between the plate and the wafer is via the air gap. The air gap for each element depends on the wafer radius of curvature and may be included in the model.

The first principles dynamic model defines a set of n differential equations, which may be expressed in compact form by the equation $\dot{T}=f(T,T_p,T_a)$. Here, T is a vector that represents the n wafer element temperatures. Simulations using these differential equations may be used to show variations in thermal response, and hence thermal dose, across the wafer due to wafer bowing.

Figure 15:
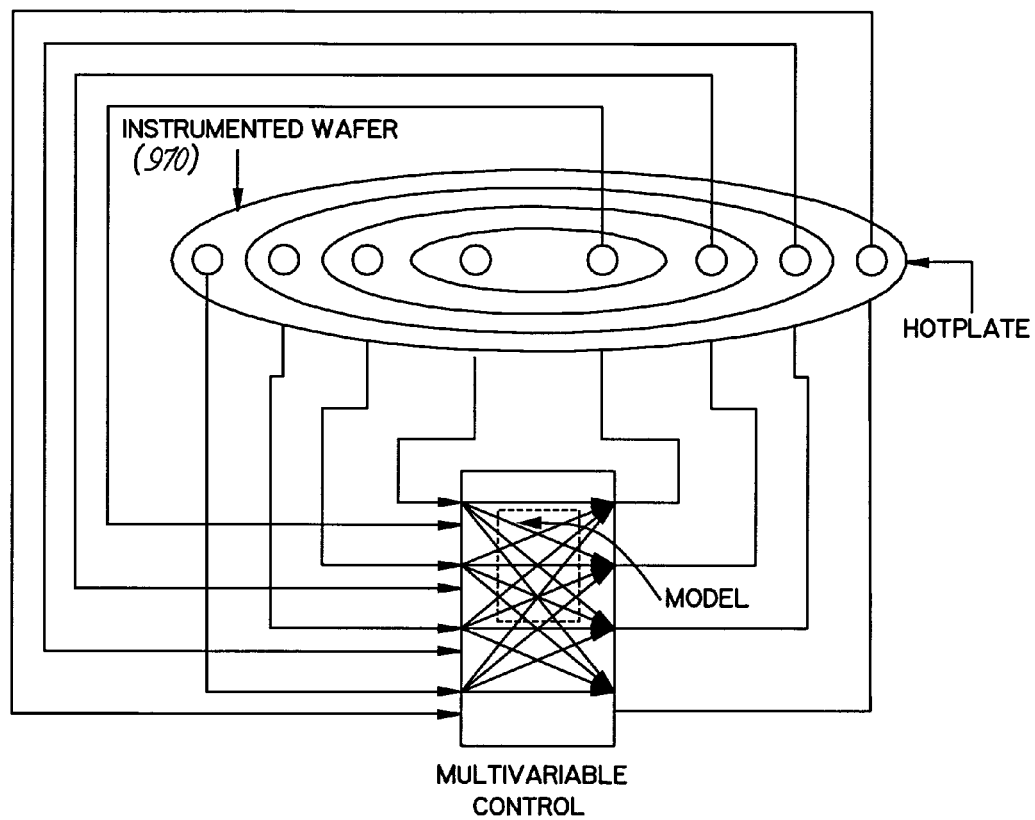
FIG. 15 is a simplified diagrammatic view of an instrumented wafer in accordance with an embodiment of the invention.

In an alterative embodiment, the ISC may be described by an on-line thermal model. For example, one method to obtain dynamic models can use real-time data collection. In such real-time models, dynamic models are created based on real-time data collected from a hotplate, for example. One method for collecting wafer temperatures is using an instrumented wafer 970 as shown in FIG. 15. In this method of wafer temperature collection, setpoint trajectories for the sensor time constants may be obtained. The setpoint trajectory is selected to exercise the thermal behavior of the system. The entire response of the system is recorded in a log file, and the log file can provide synchronous time-trajectories sensor setpoints, sensor time constants, heater power, and wafer temperatures. The measured wafer temperatures are utilized to verify the accuracy of the ISC model. Alternately, optical measurements of wafer temperatures can also be used.

The on-line thermal model may define a dynamic system with heater powers as inputs and the various temperatures, wafer as well as sensor, as output, and the model may be represented by a set of linear differential equations: $\dot{T}=f(T, P)$ where the function $f(T, P)$ is linear. To obtain the closed-loop system, a known controller may be applied around this set of equations to obtain the closed-loop response. This method can provide a high fidelity model of the wafer temperature thermal response. The on-line thermal model may, alternatively, be described by multiple linear models that describe the thermal behavior across a broad temperature range. For this purpose, the wafer temperatures may be measured at multiple temperature ranges, and a model may be created that switches from one temperature range to the next as needed.

Wafer bowing may be incorporated into either the first principles model or the on-line thermal model, which are described above, for establishing intelligent setpoint control. For the first principles model, the gap between the wafer and hotplate for each wafer element may be directly modeled. For example, if $r_c$ is defined as the radius of curvature of the wafer, then, the wafer subtends an angle $$\theta = \frac{w_d}{r_c}.$$

Based on this angle, the air gap at a given radial location may be computed as:

$$\delta_k = r_c\left(1 - \cos\frac{\theta}{k}\right).$$

One method for determining wafer bow is using Stoney's equation relating film stress to the wafer curvature:

$$\sigma_f = \frac{E'_w t_w^2}{6 t_f^2} K$$

where $\sigma_f$ is the film stress, $E_w'$ is the biaxial modulus of the wafer, $t_w$ is the thickness of the wafer, $t_f$ is the thickness of the film, and K is the radius of curvature. This basic formula may be extended to multi-film stacks.

During model development, a first principles model including wafer bowing may be implemented numerically on a suitable microprocessor in a suitable software simulation application, such as Matlab. The software application resides on a suitable electronic computer or microprocessor, which is operated so as to perform the physical performance approximation. However, other numerical methods are contemplated by the present invention.

Figure 16:
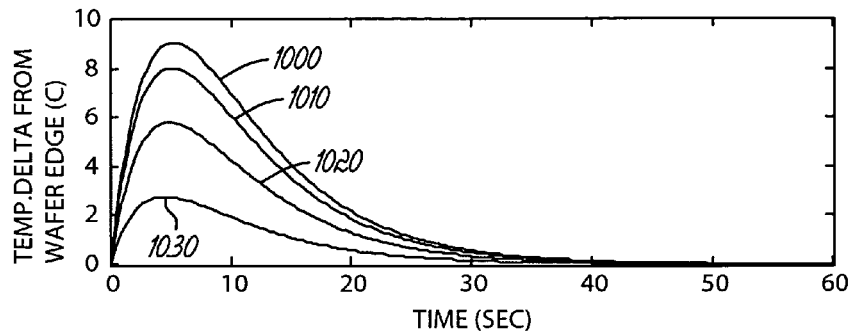
FIGS. 16 and 17 are graphical representations of simulation results in accordance with an embodiment of the invention.

FIG. 16 provides a graphical representation of the wafer radial temperature spread calculated during a simulated ramp using the first principles thermal model for characterizing the intelligent set point controller and including wafer bowing and with the wafer and the hotplate both divided into five concentric elements. The following values were assigned to parameters in the thermal response equation:

| | | |
|---|---|---|
| $k_w$ | Wafer thermal conductivity | 1.3 W cm$^{-1}$ ° C.$^{-1}$ |
| $\rho$ | Wafer density | 2.33 g/cm$^3$ |
| $C_p$ | Wafer heat capacity | 0.7 J g$^{-1}$° C.$^{-1}$ |
| $T_a$ | Ambient temperature | 20° C. |
| $k_a$ | Air gap thermal conductivity | 0.0003 W cm$^{-1}$ ° C.$^{-1}$ |
| $T_p$ | Plate temperature | 130° C. |

The wafer-hotplate air gap ($\delta_k$) was parameterized at equidistant radial locations across the wafer by:

| Element Number | Air Gap (cm) |
|---|---|
| 1 (center) | 0.0150 |
| 2 | 0.0153 |
| 3 | 0.0161 |
| 4 | 0.0174 |
| 5 (edge) | 0.0193 |

The individual curves on FIG. 16 indicate the difference determined from the simulation results between the wafer temperatures at multiple radial locations across the wafer and the wafer edge temperature as a function of time. Curve 1000 indicates the change in wafer temperature with time between elements 1 and 5 and curve 1010 indicates the change in wafer temperature with time between elements 2 and 5. Similarly, curve 1020 indicates the change in wafer temperature with time between elements 3 and 5 and curve 1030 indicates the change in wafer temperature with time between elements 4 and 5. As is apparent from the curves 1000–1030, as the air gap increases, the initial transient temperature difference increases. However, the temperature differences between curves 1000–1030 converge to uniformity as the time exceeds about 30 seconds.

Figure 17:
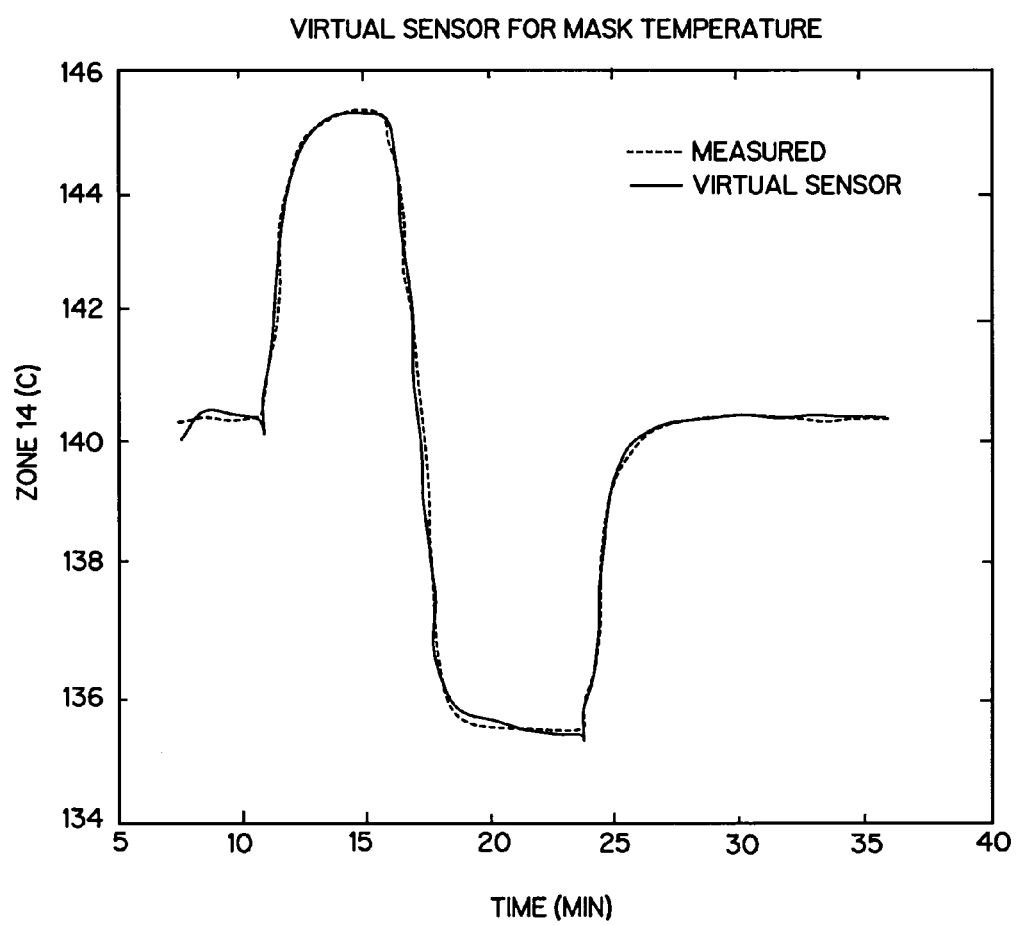

FIG. 17 shows a comparison of measured and simulated data for a virtual sensor as a function of substrate temperature. A dynamic model is used to create the virtual sensor, and the applied heater power and measured hotplate temperatures are provided as inputs, as described with regard to FIG. 12. The graph shows that the virtual sensor may accurately track substrate temperature.

Once the dynamic thermal model 904 of the system is obtained, the thermal response may be used to determine the chemical amplification and diffusion characteristic of CAR reactions. For this purpose, the dynamic thermal model 904 may be augmented with a model of the CAR reactions.

The PEB process is a thermally activated process and serves multiple purposes in photoresist processing. First, the elevated temperature of the bake drives the diffusion of the photoproducts. A small amount of diffusion may be useful in minimizing the effects of standing waves, which are the periodic variations in exposure dose throughout the depth of the film that result from interference of incident and reflected radiation. The other main purpose of the PEB is to drive an acid-catalyzed reaction that alters polymer solubility in many chemically amplified resists.

Chemical amplification is important because it allows a single photoproduct to cause many solubility-switching reactions, thus increasing the sensitivity of these photoresist systems. Some amount of acid transport is necessary in that it allows a single acid to move to many reactive polymer sites. However, acid transport from nominally exposed to unexposed regions can complicate control of resist feature dimensions. Acid transport through these reactive systems is mechanistically complex. Measurements have shown that there is a very large difference in acid mobility between the starting material, which is reactive towards acid, and the product material, which is no longer reactive).

The impact of the thermal processing is typically modeled via three activated processes: diffusion, amplification, and acid loss. The activation energies for the diffusion and amplification are both high compared to acid loss. The reaction rates are given by the usual Arrhenius equation:

$$\text{rate} = C \exp\left(-\frac{E_a}{kT}\right)$$

For example, for an APEX-E resist, the resist parameters are:

| Reaction | $E_a$ - Activation Energy (kCal/mole) | Pre-exponent C |
|---|---|---|
| Diffusivity | 35.68 | 53.16 nm$^2$/sec |
| Amplification | 35.68 | 48.1 sec$^{-1}$ |
| Acid Loss | 4.98 | 2.98 sec$^{-1}$ |

The CAR reactions may be incorporated into the thermal model to determine the thermal dose at various locations in the wafer during the PEB process. Dose computation may be made by including the ramp up, stabilization, processing, and cool-down portions of the thermal trajectories, and these may be more accurate than simply "at-temperature" calculations.

For example, the thermal dose at the $k^{th}$ radial element may be calculated as:

$$d_k = \int_{t_0}^{t_f} C \exp\left(-\frac{E_a}{kT_k(t)}\right) dt.$$

In the above calculations, the temperature time-trajectory $T_k(t)$ may be obtained from the multi-nodal thermal model (FIG. 14).

A vector D of the thermal dose is defined that has a component $d_n$ at each of the radial element locations.

$$D = \begin{bmatrix} d_1 \\ \vdots \\ d_n \end{bmatrix}$$

Variations in the thermal dose vector D may be minimized by using the dynamic setpoint trajectories. A model-based linear or nonlinear multivariable control approach may be used to model the thermal doses in which the controller comprises a mathematical model of the system to be controlled. The multivariable controller may be based on any of the modern control design methods such as linear-quadratic-gaussian (LQG) method, linear quadratic regulator (LQR) method, H-infinity (H-inf) method, etc. The thermal dose model may be either linear or nonlinear and either SISO or MIMO. The multivariable control approach (i.e., MIMO) considers all inputs and their effects on the outputs. Several other approaches for modeling the thermal doses are available, such as physical models, and data-driven models.

In a typical recipe, the setpoint is held constant for a given period of time. However, allowing the setpoints to vary in a small enough "window" of temperatures around the nominal value provides additional degrees of freedom in achieving end-of-run thermal dose uniformity. One such method of modeling the thermal doses is to use intelligent time-varying setpoint trajectories for thermal processing. For this purpose, the temperature setpoints may be parameterized into a vector of intelligent setpoints, and define a vector R that contains intelligent setpoints representing time-varying perturbations around the nominal setpoints:

$$R = \begin{bmatrix} r_1 \\ \vdots \\ r_m \end{bmatrix}$$

A process sensitivity matrix M is created by making small temperature perturbation at each of the breakpoints for each control zone. The resultant perturbations in the thermal dose may then be written as:

$$\begin{bmatrix} d_1 \\ \vdots \\ d_n \end{bmatrix} = M \begin{bmatrix} r_1 \\ \vdots \\ r_m \end{bmatrix}$$

Now, the optimization task becomes one of finding the appropriate values of vector R such that the resultant thermal dose vector D removes the across-wafer variations seen in the thermal dose vector D obtained from the nominal trajectory.

For example, the sensitivity matrix M may be determined for a system having 5 concentric control zone and 3 breakpoints for each control zone by making a 1° C. perturbation at each of the breakpoints for each control zone. An exemplary nominal setpoint trajectory consists of ramping from 20° C. to 130° C. in 5 seconds and the holding at 130° C. for 45 seconds (see Table 3 below).

| Step Number | Time (sec) | Temp (° C.) |
|---|---|---|
| 1 | 0 | 20 |
| 2 | 5 | 130 |
| 3 | 50 | 130 |

This nominal recipe may be updated to include an additional breakpoint in step number 3 at 20 seconds into the step. In this way, there are three intelligent setpoints (time points) where changes to the temperature setpoints may be made, i.e., at steps 2, 3, and 4, as shown in Table 4.

| Step Number | Recipe Breakpoint Number | Time (sec) | Temp (° C.) |
| --- | --- | --- | --- |
| 1 | | 0 | 20 |
| 2 | 1 | 5 | 130 |
| 3 | 2 | 20 | 130 |
| 4 | 3 | 50 | 130 |

Figure 18:
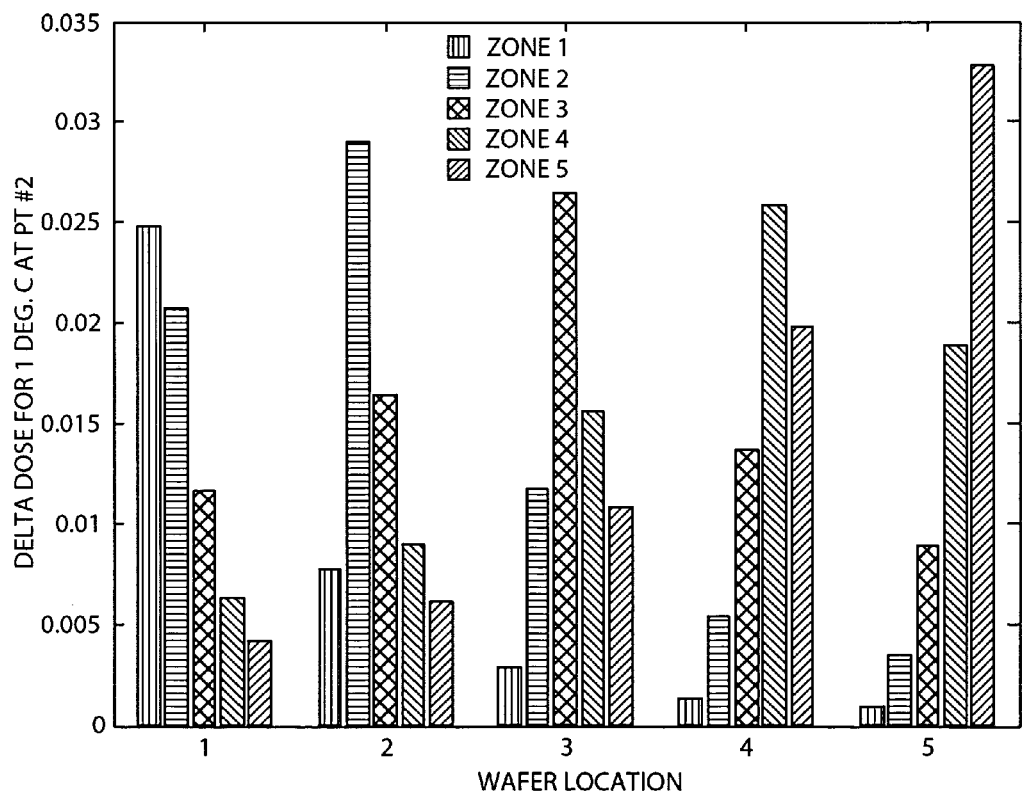
FIG. 18 is a graphical representation of a sensitivity matrix used in the dynamic optimization in accordance with an embodiment of the invention.

The exemplary sensitivity matrix for use in the dynamic optimization is shown graphically in FIG. 18. Each line on FIG. 18 shows the effect on the thermal dose in each of the control zones by making a 1° C. variation in the temperature setpoint at the breakpoint number 2.

When creating intelligent setpoints, the resultant CD data, profile data, and/or uniformity data on the wafer depends significantly on the dissolution rate, which in turn depends on the thermal dose at various locations. Methods for computing the thermal dose at across-wafer locations and also the sensitivity of the thermal dose to temperature setpoint variations have been described above. The CD, profile, and/or uniformity C may be considered to be proportional to the thermal dose as $C=\alpha \cdot D$, in which $\alpha$ is a proportionality constant relating the measured CD, profile and/or uniformity data to the thermal dose, so that, accordingly, the variation in CD, profile, and/or uniformity is also proportional to variation in thermal dose. Then, variation in CD, profile, and/or uniformity may be written as:

$$\begin{bmatrix} c_1 \\ \vdots \\ c_n \end{bmatrix} = \alpha \cdot M \begin{bmatrix} r_1 \\ \vdots \\ r_m \end{bmatrix}.$$

The variation in the CD, profile, and/or uniformity across the wafer may be reduced by computing intelligent setpoint using the sensitivity matrix M. The intelligent setpoints may be optimized by solving a constrained quadratic optimization problem given by:

$$\min \|C - \alpha \cdot MR\|, \text{ where } r_{min} < r_m < r_{max}$$

Thus, the procedure to find the intelligent setpoints becomes:

1) Run a process using the nominal setpoints and make CD, profile, and/or uniformity measurements across the wafer at the selected locations. CD, profile, and/or uniformity measurements may be made using several methods. One such method uses ODP. Alternatively, CD, profile, and/or uniformity measurement data may be obtained from feed forward data.

2) Select the desired value of the CD, profile, and/or uniformity and create the variation vector C, which is the difference between the desired value and the measurement data. For example, a desired value may be an average value, a minimum value, a maximum value, a 3-sigma value, or another computed value.

3) Solve the optimization problem shown above to find the intelligent setpoints R.

4) Update the recipe with the intelligent setpoints found in the previous step, and re-run the process. For example, updated values may be obtained by running an updated recipe.

5) Iterate until the desired uniformity is achieved. For example, the desired uniformity can comprise at least one of a 3-sigma value for a thermal dose variation, a 3-sigma value for a wafer temperature variation, a 3-sigma value for a critical dimension variation, a 3-sigma value for a profile measurement variation, and a 3-sigma value for a uniformity measurement variation. In certain embodiments, the uniformity may be less than or equal to approximately two percent. After the iteration has converged and the desired uniformity is achieved, the results may be stored for subsequent use.

Figure 19:
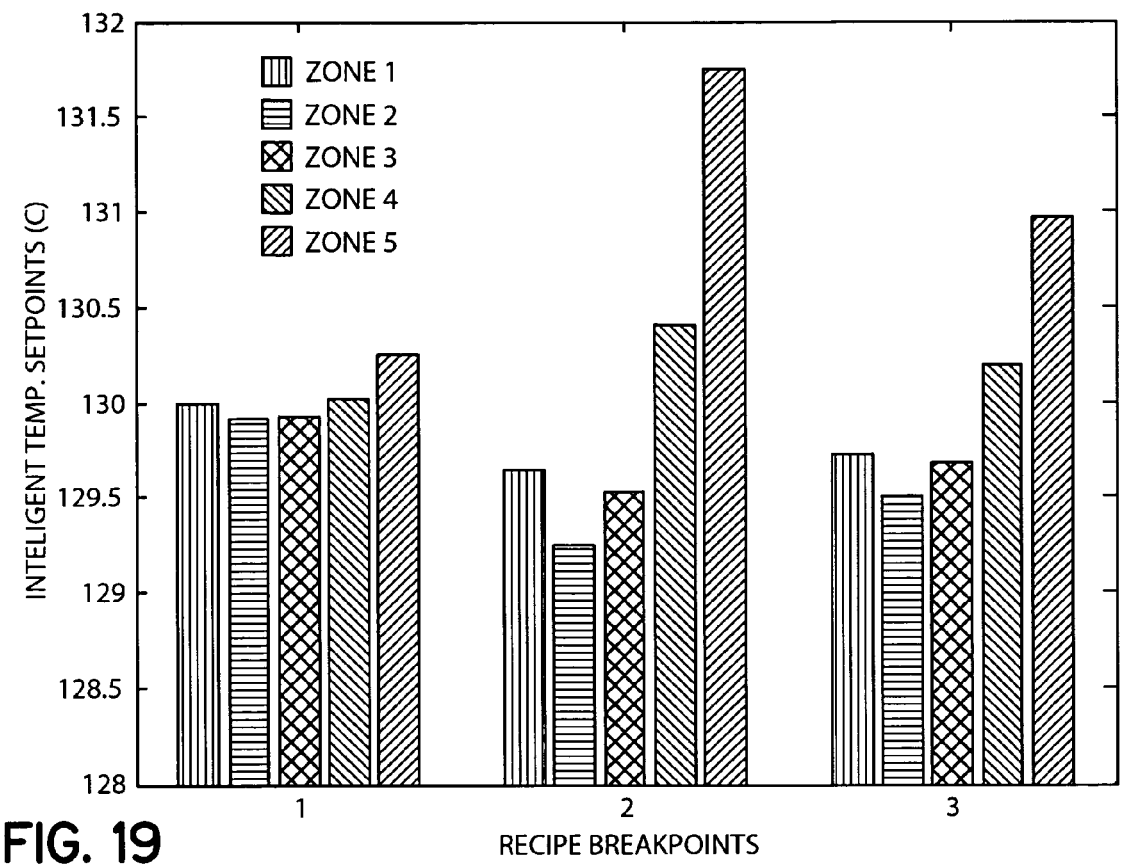
FIG. 19 is a graphical representation of a set of intelligent setpoints computed using trajectory optimization in accordance with an embodiment of the invention.
Figure 20:
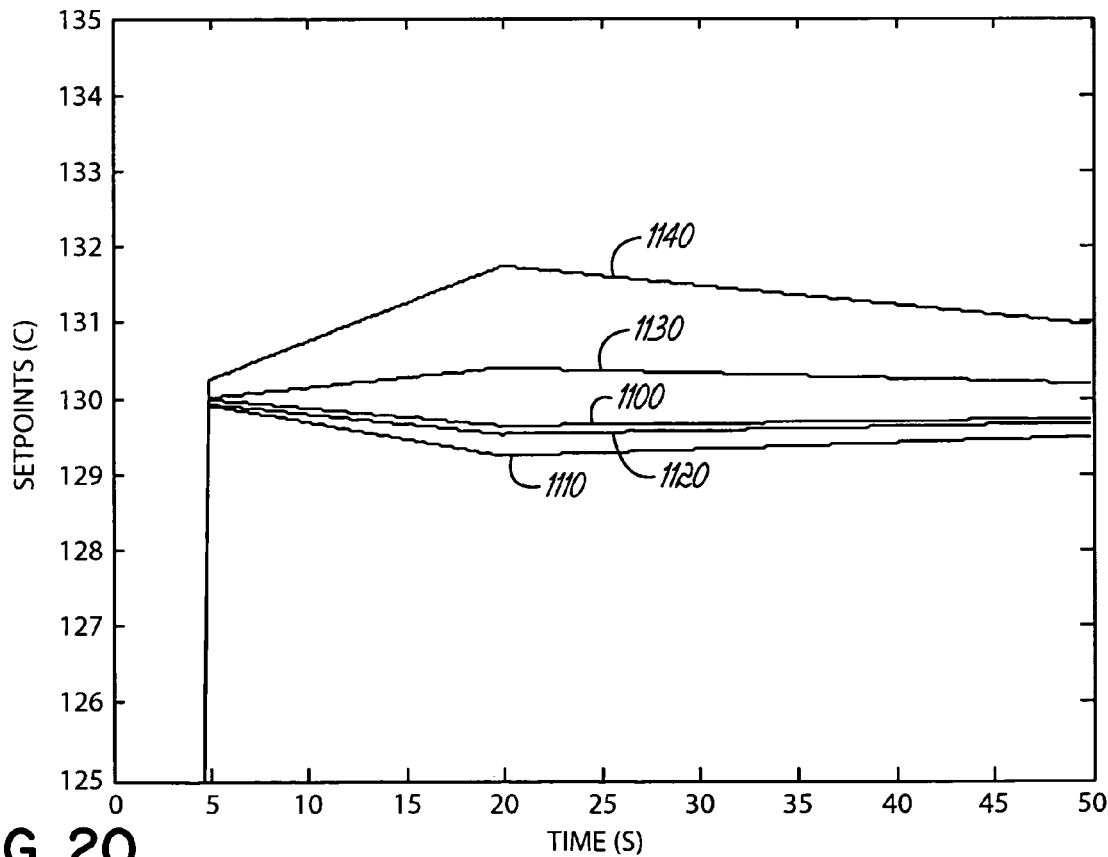
FIG. 20 is a graphical representation of a time sequence for intelligent setpoints computed using the trajectory optimization in accordance with an embodiment of the invention.

To illustrate the procedure, the simulation model and the sensitivity matrix computed above were used to solve a quadratic optimization problem to obtain optimized intelligent setpoints. In this example, the thermal dose (which is proportional to the CD) was used directly. With the nominal setpoints, the thermal dose across the wafer had a 3-sigma variation of 12.1%. FIG. 19 is a graphical representation of the intelligent setpoints for each of the three recipe breakpoints computed using trajectory optimization and the exemplary sensitivity matrix calculated above (FIG. 18). FIG. 20 is a graphical representation of the intelligent setpoints as a function of process time in each of the five control zones computed using trajectory optimization. Curves 1100, 1110, 1120, 1130 and 1140 represent the time dependence of zones one through five, respectively. With this exemplary set of computed intelligent setpoints, the thermal dose variation is reduced to 3-sigma variation of 0.13%.

A library of optimized intelligent setpoints for corresponding wafer bows may be defined that minimize across-wafer CD and/or profile variation for given wafer bow. For a given wafer, the on-line controller can select the appropriate intelligent setpoints for application to the thermal control. Several methods are available to achieve this. In one approach, the on-line model determines the amount of bow by examining the real-time response of wafer and hotplate. Based on the response, the on-line model selects the appropriate optimized intelligent setpoints from the library. In another approach, information on the film stack, including the n, k values, may be fed to the controller. Based on the n, k values, the controller can determine film stress and the associated wafer bow and select the appropriate optimized intelligent setpoints from the library. As described above, Stoney's equation may be used for determining wafer bow.

Figure 21:
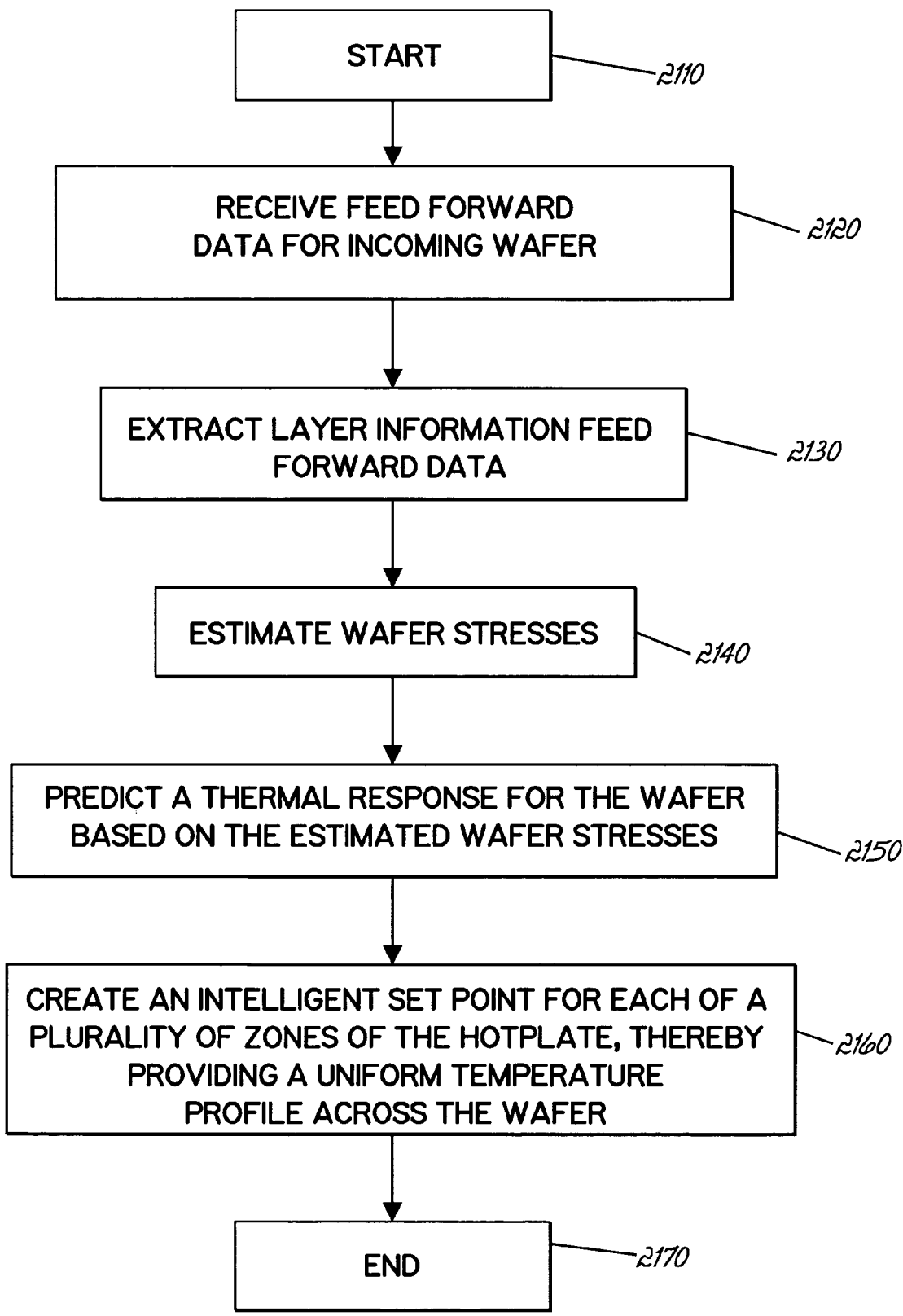
FIG. 21 is a simplified flow diagram of a method for operating a heat treatment apparatus in accordance with an embodiment of the invention.

FIG. 21 illustrates a simplified flow diagram of a method for operating a heat treatment apparatus in accordance with an embodiment of the invention. Procedure 2100 starts in 2110.

In 2120, the heat treatment apparatus receives feed forward data for an in-coming wafer. The feed forward data can include ODP data, such as critical dimension (CD) data, profile data, and uniformity data, and optical data, such as refractive index (n) data and extinction coefficient (k) data.

In 2130, layer information is extracted from the feed forward data. For example, layer information can include the number of layers, layer position, layer composition, layer uniformity, layer density, and layer thickness. Layers can include resist material, dielectric material, and/or ARC material. In addition, n and k values for one or more layers may be extracted.

In 2140, wafer stresses may be estimated using the layer information. Wafer stresses may be used to determine a wafer profile. For example, a wafer may have a non-uniform profile that is caused by a previous process step.

In 2150, a dynamic thermal model may be used to predict the thermal response for the in-coming wafer based on the estimated wafer stresses.

In 2160, an intelligent setpoint is determined for each of the plurality of zones associated with a hotplate. In this way, a uniform temperature is provided across the wafer even if the wafer has an uneven profile.

In 2170, procedure 2100 ends. For example, after the intelligent setpoints have been determined, the hotplate may be heated using the setpoint values and a wafer may be positioned on the hotplate. Even if the wafer is bowed, the wafer will be uniformly heated to the desired temperature in a relatively short amount of time.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicants' general inventive concept.

What is claimed is:

1. A method of operating a thermal processing system comprising:
   positioning a wafer for processing by the thermal processing system on a hotplate comprising a plurality of zones;
   receiving feed forward data;
   estimating wafer stresses using the feed forward data;
   creating a thermal model for a gap between the wafer and the hotplate, wherein a thermal response for the gap is predicted based on the estimated wafer stresses;
   creating a dynamic thermal model of the thermal processing system that incorporates the thermal model for the gap;
   establishing a plurality of intelligent setpoints using the dynamic thermal model of the thermal processing system, wherein each of the plurality of intelligent setpoints is associated with a corresponding one of the plurality of zones; and
   reducing critical dimension (CD) variation across the wafer, profile variation across the wafer, or uniformity variation across the wafer, or a combination of two or more thereof by controlling an actual temperature of each of the plurality of zones of the hotplate using a corresponding one of the plurality of intelligent setpoints during processing.

2. The method of claim 1 wherein wafer stresses are estimated using refractive index (n) data, or extinction coefficient (k) data, or a combination thereof extracted from the feed forward data.

3. The method of claim 1 wherein the feed forward data comprises layer information including the number of layers, layer position, layer composition, layer uniformity, layer density, or layer thickness, or a combination of two or more thereof.

4. The method of claim 1 wherein the feed forward data includes critical dimension (CD) data for the wafer, profile data for the wafer, or uniformity data for the wafer, or a combination of two or more thereof.

5. The method of claim 1 wherein the feed forward data includes critical dimension (CD) data for a plurality of locations on the wafer, profile data for a plurality of locations on the wafer, or uniformity data for a plurality of locations on the wafer, or a combination of two or more thereof.

6. The method of claim 1 wherein the feed forward data includes a plurality of locations radially positioned on the wafer.

7. The method of claim 1 wherein the feed forward data includes a plurality of locations non-radially positioned on the wafer.

8. A method of operating a thermal processing system comprising:
   positioning a wafer for processing by the thermal processing system on a hotplate comprising a plurality of zones;
   examining a real-time response of the wafer and the hotplate;
   estimating wafer stresses using the real-time response;
   creating a thermal model for a gap between the wafer and the hotplate, wherein a thermal response for the gap is predicted based on the estimated wafer stresses;
   creating a dynamic thermal model of the thermal processing system that incorporates the thermal model for the gap;
   establishing a plurality of intelligent setpoints using the dynamic thermal model of the thermal processing system, wherein each of the plurality of intelligent setpoints is associated with a corresponding one of the plurality of zone; and
   reducing critical dimension (CD) variation across the wafer, profile variation across the wafer, or uniformity variation across the wafer, or a combination of two or more thereof by controlling an actual temperature of each of the plurality of zones of the hotplate using a corresponding one of the plurality of intelligent setpoints during processing.

9. The method of claim 8 further comprising:
   modeling a thermal interaction between the zones of the hotplate; and
   incorporating the model of the thermal interaction into the dynamic thermal model of the system.

10. The method of claim 8 further comprising:
    creating a virtual sensor for estimating a temperature for the wafer; and
    incorporating the virtual sensor into the dynamic thermal model of the system.

11. The method of claim 8 further comprising:
    modeling a thermal interaction between the hotplate and an ambient environment; and
    incorporating the model for the thermal interaction into the dynamic thermal model of the system.

12. The method of claim 8 further comprising:
    creating a diffusion-amplification model of a resist carried by the wafer; and
    incorporating the diffusion-amplification model into the dynamic thermal model of the system.

13. A method of operating a thermal processing system comprising:
    positioning a wafer for processing by the thermal processing system on a hotplate comprising a plurality of zones;
    creating a dynamic thermal model of the thermal processing system;
    creating a variation vector D, wherein the variation vector comprises differences between measurement data and a desired value;
    establishing a plurality of intelligent setpoints using the dynamic thermal model of the thermal processing system, wherein each of the plurality of intelligent setpoints is associated with a corresponding one of the plurality of zones;

parameterizing at least one nominal setpoint into a vector R comprising at least one of the plurality of intelligent setpoints;

creating a sensitivity matrix using the dynamic thermal model;

determining the at least one intelligent setpoint by solving an optimization problem comprising $$\min_{r} \|D - \alpha \cdot MR\|,$$

wherein $r_{min} < r < r_{max}$, R is the vector comprising the at least one intelligent setpoint, M is the sensitivity matrix, $\alpha$ is a proportionality constant relating the measurement data to the sensitivity matrix M, and D is the variation vector; and reducing critical dimension (CD) variation across the wafer, profile variation across the wafer, or uniformity variation across the wafer, or a combination of two or more thereof by controlling an actual temperature of each of the plurality of zones of the hotplate using a corresponding one of the plurality of intelligent setpoints during processing.

14. The method of claim 13 further comprising:
updating a recipe with the plurality of intelligent setpoint;
running the updated recipe;
obtaining updated measurement data; and
iterating until a desired uniformity is achieved.

15. The method of claim 14 wherein the desired uniformity comprises a 3-sigma variation of less than approximately two percent.

16. The method of claim 15 wherein the desired uniformity comprises a 3-sigma variation of less than approximately one percent.

17. The method of claim 13 further comprising:
receiving feed forward data;
obtaining the measurement data from the feed forward data, wherein the measurement data comprises critical dimension measurements, profile measurements, or uniformity measurements, or a combination of two or more thereof; and
determining the desired value, wherein the desired value comprises a desired critical dimension, a desired profile, or a desired uniformity, or a combination of two or more thereof.

18. The method of claim 13 further comprising:
executing a process using a recipe having at least one nominal setpoint for each zone of the hotplate;
obtaining the measurement data from the executed process wherein the measurement data comprises critical dimension measurements, profile measurements, or uniformity measurements, or a combination of two or more thereof; and
determining the desired value, wherein the desired value comprises a desired critical dimension, a desired profile, or a desired uniformity, or a combination of two or more thereof.

19. The method of claim 13 further comprising:
making temperature perturbations for each zone of the hotplate; and
establishing the sensitivity matrix M using results of the temperature perturbations.

20. The method of claim 13 further comprising: using an instrumented wafer to establish the sensitivity matrix M.

21. The method of claim 13 further comprising:
determining a vector D of a thermal dose at each radial element location, wherein $$D = \begin{bmatrix} d_1 \\ \vdots \\ d_n \end{bmatrix};$$

characterizing perturbations in the thermal dose as $$\begin{bmatrix} d_1 \\ \vdots \\ d_n \end{bmatrix} = M \begin{bmatrix} r_1 \\ \vdots \\ r_m \end{bmatrix}; \text{ and}$$

determining values of the vector r, such that the vector d removes across wafer variations in the vector D.

22. A method of operating a thermal processing system comprising:
positioning a wafer for processing by the thermal processing system on a hotplate comprising a plurality of zones;
estimating wafer warpage;
creating a thermal model for a gap between the wafer and the hotplate, wherein a thermal response for the gap is predicted based on the estimated wafer warpage;
creating a dynamic thermal model of the thermal processing that incorporates the thermal model for the gap;
establishing a plurality of intelligent setpoints using the dynamic thermal model of the thermal processing system, wherein each of the plurality of intelligent setpoints is associated with a corresponding one of the plurality of zones; and
reducing critical dimension (CD) variation across the wafer, profile variation across the wafer, or uniformity variation across the wafer, or a combination of two or more thereof by controlling an actual temperature of each of the plurality of zones of the hotplate using a corresponding one of the plurality of intelligent setpoints during processing.

23. The method of claim 22 further comprising:
modeling a thermal interaction between the zones of the hotplate; and
incorporating the model of the thermal interaction into the dynamic thermal model of the system.

24. The method of claim 22 further comprising:
creating a virtual sensor for estimating a temperature for the wafer; and
incorporating the virtual sensor into the dynamic thermal model of the system.

25. The method of claim 22 further comprising:
modeling a thermal interaction between the hotplate and an ambient environment; and
incorporating the model for the thermal interaction into the dynamic thermal model of the system.

26. The method of claim 22 further comprising:
creating a diffusion-amplification model of a resist carried by the wafer; and
incorporating the diffusion-amplification model into the dynamic thermal model of the system.

* * * * *

UNITED STATES PATENT AND TRADEMARK OFFICE
CERTIFICATE OF CORRECTION

PATENT NO. : 7,101,816 B2
APPLICATION NO. : 10/747842
DATED : September 5, 2006
INVENTOR(S) : Kaushal et al.

Page 1 of 1

It is certified that error appears in the above-identified patent and that said Letters Patent is hereby corrected as shown below:

Column 15:
Line 44, change "min" to --min--.
r

Column 18:
Line 25, change "zone" to --zones--.

Column 19:
Line 25, change "setpoint" to --setpoints--.

Signed and Sealed this

Twentieth Day of March, 2007

JON W. DUDAS
*Director of the United States Patent and Trademark Office*